(12) United States Patent
Mitsukura et al.

(10) Patent No.: US 11,990,396 B2
(45) Date of Patent: May 21, 2024

(54) SUBSTRATE AND METHOD FOR MANUFACTURING THE SAME

(71) Applicant: SHOWA DENKO MATERIALS CO., LTD., Tokyo (JP)

(72) Inventors: Kazuyuki Mitsukura, Tokyo (JP); Masaya Toba, Tokyo (JP); Yoshinori Ejiri, Tokyo (JP); Kazuhiko Kurafuchi, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 0 days.

(21) Appl. No.: 18/068,032

(22) Filed: Dec. 19, 2022

(65) Prior Publication Data
US 2023/0118368 A1 Apr. 20, 2023

Related U.S. Application Data

(63) Continuation of application No. 16/983,012, filed on Aug. 3, 2020, now Pat. No. 11,562,951, which is a
(Continued)

(30) Foreign Application Priority Data

Mar. 25, 2016 (JP) .................. 2016-061899

(51) Int. Cl.
*H01L 23/498* (2006.01)
*H01L 21/48* (2006.01)
(Continued)

(52) U.S. Cl.
CPC .... *H01L 23/49822* (2013.01); *H01L 21/4857* (2013.01); *H01L 23/12* (2013.01);
(Continued)

(58) Field of Classification Search
CPC . H01L 23/49822; H01L 23/12; H01L 23/145; H01L 23/32; H01L 23/49866;
(Continued)

(56) References Cited

U.S. PATENT DOCUMENTS 5,905,298 A * 5/1999 Watatani ............. H01L 23/5222
257/295
6,190,834 B1 2/2001 Narahara et al.
(Continued)

FOREIGN PATENT DOCUMENTS

CN 104064550 A 9/2014
JP H09-283520 A 10/1997
(Continued)

OTHER PUBLICATIONS

Jinseong Kim et al., "Application of Through Mold Via (TMV) as PoP Base Package", 2008 58th Electronic Components and Technology Conference in IEEE, May 27, 2008, p. 1089-p. 1092.
(Continued)

*Primary Examiner* — Peniel M Gumedzoe
(74) *Attorney, Agent, or Firm* — FITCH, EVEN, TABIN & FLANNERY, LLP

(57) ABSTRACT

An organic interposer includes: a first organic insulating layer including a groove; a first metal wire located in the groove; a barrier metal material covering the first metal wire; and a second metal wire located above the first metal wire, wherein the barrier metal material includes: a first barrier metal film interposed between the first metal wire and an inner surface of the groove; and a second barrier metal film located on the first metal wire, and wherein the second metal wire is in contact with both of the first barrier metal film and the second barrier metal film.

20 Claims, 14 Drawing Sheets

Related U.S. Application Data continuation of application No. 16/087,269, filed as application No. PCT/JP2017/006840 on Feb. 23, 2017, now Pat. No. 10,756,008.

(51) Int. Cl.
| | | |
|---|---|---|
| *H01L 23/12* | (2006.01) | |
| *H01L 23/14* | (2006.01) | |
| *H01L 23/32* | (2006.01) | |
| *H01L 23/538* | (2006.01) | |
| *H01L 25/065* | (2023.01) | |
| *H05K 1/09* | (2006.01) | |

(52) U.S. Cl.
CPC ............ *H01L 23/145* (2013.01); *H01L 23/32* (2013.01); *H01L 23/49866* (2013.01); *H01L 23/49894* (2013.01); *H01L 23/5383* (2013.01); *H01L 23/5384* (2013.01); *H01L 23/5386* (2013.01); *H01L 23/5389* (2013.01); *H01L 25/0652* (2013.01); *H01L 2225/06506* (2013.01); *H01L 2225/06548* (2013.01); *H01L 2225/06572* (2013.01); *H05K 1/09* (2013.01)

(58) Field of Classification Search
CPC ........... H01L 23/49894; H01L 23/5383; H01L 23/5384; H01L 23/5386; H01L 23/5389; H01L 21/4857; H01L 25/0652; H01L 2225/06506; H01L 2225/06548; H01L 2225/06572; H05K 1/09
See application file for complete search history.

(56) References Cited

U.S. PATENT DOCUMENTS

| | | | |
|---|---|---|---|
| 6,958,547 | B2 | 10/2005 | Dubin et al. |
| 7,777,337 | B2 * | 8/2010 | Harada ............. H01L 21/76805 |
| | | | 257/E23.145 |
| 2004/0009664 | A1 | 1/2004 | Chan et al. |
| 2004/0188748 | A1 | 9/2004 | Matsuhashi |
| 2007/0018332 | A1 | 1/2007 | Ueno et al. |
| 2007/0275557 | A1 | 11/2007 | Yang et al. |
| 2008/0142989 | A1 | 6/2008 | Hayashi et al. |
| 2008/0197500 | A1 | 8/2008 | Yang et al. |
| 2009/0020883 | A1 * | 1/2009 | Nomura ............ H01L 21/76831 |
| | | | 257/774 |
| 2010/0207274 | A1 | 8/2010 | Hayashi et al. |
| 2011/0021017 | A1 | 1/2011 | Ueda |
| 2011/0221071 | A1 | 9/2011 | Motohashi |
| 2014/0264875 | A1 | 9/2014 | Kanki |
| 2016/0141246 | A1 | 5/2016 | Kim et al. |
| 2016/0172287 | A1 | 6/2016 | Arisaka et al. |

FOREIGN PATENT DOCUMENTS

| | | |
|---|---|---|
| JP | H11-049847 A | 2/1999 |
| JP | 2001-351918 A | 12/2001 |
| JP | 2007-035734 A | 2/2007 |
| JP | 2008-205458 A | 9/2008 |
| JP | 2010-037617 A | 2/2010 |
| JP | 2012-146752 A | 8/2012 |
| JP | 2012-529770 A | 11/2012 |
| JP | 2014-183127 A | 9/2014 |
| KR | 2001-0076659 A | 8/2001 |

OTHER PUBLICATIONS

Seung Wook Yoon et al., "Advanced Low Profile PoP Solution with Embedded Wafer Level PoP (eWLB-PoP) Technology", 2012 IEEE 62nd Electronic Components and Technology Conference, May 29, 2012, p. 1250-p. 1254.

\* cited by examiner

SUBSTRATE AND METHOD FOR MANUFACTURING THE SAME

CROSS REFERENCE TO RELATED APPLICATIONS

The present application is a continuation application of prior U.S. patent application Ser. No. 16/983,012 filed on Aug. 3, 2020, which is a continuation application of prior U.S. patent application Ser. No. 16/087,269 filed on Sep. 21, 2018, which is a U.S. national phase application filed under 35 U.S.C. § 371 of International Application No. PCT/JP2017/006840, filed Feb. 23, 2017, designating the United States, which claims priority from Japanese Patent Application No. 2016-061899, filed Mar. 25, 2016, which are hereby incorporated herein by reference in their entirety.

BACKGROUND

The present disclosure relates to an organic interposer and a method for manufacturing an organic interposer.

An implementation form of mounting chips each having different performance on one package is proposed for the purpose of enhancing density and performance of a semiconductor package. In this case, a high-density inter-chip connection technique excellent in terms of costs is important (see, for example, Patent Literature 1).

Non Patent Literature 1 and Non Patent Literature 2 describe a mode of Package on Package (PoP) connecting different packages by laminating on a package a different package through flip-chip assembly. This PoP is a mode widely adopted in smart phones, tablet terminals, and the like.

Further, as another form for performing high-density implementation of a plurality of chips, there are proposed a packaging technique using an organic substrate having high-density wires (organic interposer), a fan out type packaging technique (FO-WLP: Fan Out-Wafer Level Package) having a through mold via (TMV), a packaging technique using a silicon or glass interposer, a packaging technique using a through silicon via (TSV), a packaging technique using a chip embedded in a substrate for transmission between chips, and the like.

Especially, in the case where semiconductor chips are mounted in the organic interposer and the FO-WLP, a fine wiring layer for allowing the semiconductor chips to have electrical continuity of high density becomes necessary (see, for example, Patent Literature 2).

CITATION LIST

Patent Literature

[Patent Literature 1]
Japanese Unexamined Patent Publication No. 2012-529770
[Patent Literature 2]
U.S. Patent Application Publication No. 2011/0221071

Non Patent Literature

[Non Patent Literature 1]
Jinseong Kim et al., "Application of Through Mold Via (TMV) as PoP Base Package", Electronic Components and Technology Conference (ECTC), p. 1089-1092 (2008)

[Non Patent Literature 2]
S. W. Yoon et al., "Advanced Low Profile PoP Solution with Embedded Wafer Level PoP (eWLB-PoP) Technology", ECTC, p. 1250-1254 (2012)

SUMMARY

An organic interposer having a laminate (organic insulating laminate) prepared by laminating a plurality of organic insulating layers may be used for a build-up substrate, a wafer level package (WLP), a bottom package of a fan out type PoP, or the like in some cases. For example, in the case where a plurality of fine wires having a line width and a space width of 10 μm or less are disposed in this organic insulating laminate, the wires are formed using a trench method. The trench method refers to a method for forming a metal layer, which is to be wires, by a plating method or the like in trenches (grooves) formed in the surface of the organic insulating layer. Therefore, the shape of the wires formed on the organic insulating layer has a shape along the shape of the grooves.

In forming the fine wires in the organic insulating laminate by the trench method, for example, a metal material having a high electrical conductivity such as copper is used in some cases for the purpose of lowering costs and suppressing an increase in wire resistance. In the case where the wires are formed using such a metal material, the metal material diffuses in the organic insulating laminate in some cases. In this case, there is a risk that the wires short-circuit through the diffused metal material, and there is a problem in the insulation reliability of the organic interposer.

The object of one aspect of the present invention is to provide an organic interposer capable of improving the insulation reliability and a method for manufacturing the organic interposer.

The organic interposer according to the first aspect of the present invention comprises: an organic insulating laminate comprising a plurality of organic insulating layers; and a plurality of wires arranged in the organic insulating laminate, wherein each of the wires and each of the organic insulating layers are separated by a barrier metal film.

In this organic interposer, each of the wires and each of the organic insulating layers are separated by a barrier metal film. Therefore, the diffusion of the metal material in the wires into the organic insulating laminate is suppressed by the barrier metal film. Accordingly, the short-circuit between the plurality of wires through the diffused metal material can be suppressed, and therefore the insulation reliability of the organic interposer can be improved.

The organic insulating laminate may comprise: a first organic insulating layer including a plurality of grooves each having each of the wires disposed therein; and a second organic insulating layer laminated to the first organic insulating layer in such a way as to embed the wires. In this case, each of the plurality of wires has a shape along each of the grooves in the first organic insulating layer. Therefore, fine wires can be easily formed by forming the plurality of grooves having fine width and interval.

The barrier metal film may comprise: a first barrier metal film provided between each of the wires and an inner surface of each of the grooves; and a second barrier metal film provided between each of the wires and the second organic insulating layer. In this case, the diffusion of the metal material in the wires into the first organic insulating layer is satisfactorily suppressed by the first barrier metal film. In addition, the diffusion of the metal material into the second organic insulating layer is satisfactorily suppressed by the second barrier metal film.

The first barrier metal film may comprise at least one of titanium, nickel, palladium, chromium, tantalum, tungsten, and gold. Each of titanium, nickel, palladium, chromium, tantalum, tungsten, and gold hardly diffuses into the first and the second organic insulating layer, and therefore the insulation reliability of the organic interposer can be further improved.

The second barrier metal film may be a plated film. In this case, the second barrier metal film can be selectively formed on the wires in the grooves, and therefore the steps for manufacturing the organic interposer can be simplified.

The second barrier metal film may be a nickel-plated film. In this case, the second barrier metal film having a satisfactory flatness can be easily formed. Besides, nickel hardly diffuses into the first and the second organic insulating layer, and therefore the insulation reliability of the organic interposer can be suitably improved.

The second barrier metal film may be a palladium-plated film. In this case, the second barrier metal film can be easily thinned. Besides, palladium hardly diffuses into the first and the second organic insulating layer, and therefore the insulation reliability of the organic interposer can be suitably improved.

The thickness of the second barrier metal film may be 0.001 μm or more and 1 μm or less. In this case, the diffusion of the metal material in the wires into the second organic insulating layer is satisfactorily suppressed by the second barrier metal film.

The surface roughness of the second barrier metal film may be 0.01 μm or more and 1 μm or less. In this case, the second barrier metal film can be closely contact with the second organic insulating layer. In addition, disconnection and the like in the organic interposer, the disconnection and the like based on the surface roughness of the second barrier metal film, can be suppressed The thickness of the first organic insulating layer may be 1 μm or more and 10 μm or less. In this case, the plurality of grooves having a width and an interval of 10 μm or less can be formed using the first organic insulating layer.

The first organic insulating layer may be a cured film prepared by curing a photosensitive organic insulating resin comprising: a photoacid generator; a phenolic hydroxy group-containing compound; and a thermosetting resin. In this case, the grooves having a fine width and interval can be easily formed in the first organic insulating layer. Besides, moisture contained in the first organic insulating layer can be reduced, and therefore the metal material becomes hard to diffuse into the first organic insulating layer. Accordingly, the insulation reliability of the organic interposer can be improved.

The method for manufacturing an organic interposer according to the second aspect of the present invention comprises: a first step of forming a plurality of grooves in a first organic insulating layer; a second step of forming a first barrier metal film on the first organic insulating layer in such a way as to cover an inner surface of each of the grooves; a third step of forming a wiring layer on the first barrier metal film in such a way as to embed the grooves; a fourth step of thinning the wiring layer in such a way as to expose the first organic insulating layer; a fifth step of forming a second barrier metal film in such a way as to cover the wiring layer in the grooves; and a sixth step of forming a second organic insulating layer on the first organic insulating layer and on the second barrier metal film.

In this method for manufacturing an organic interposer, the first barrier metal film can be formed between the inner surface of each groove and the wiring layer through the first to the third step. In addition, the second barrier metal film can be formed between the wiring layer and the second organic insulating layer in a lamination direction of the organic insulating layer through the fourth to the sixth step. Therefore, the diffusion of the metal material in the wiring layer into the first and the second organic insulating layer can be suppressed by the first and the second barrier metal films. Accordingly, the short-circuit between the plurality of wires through the diffused metal material can be suppressed, and therefore the insulation reliability of the organic interposer can be improved.

In the third step, the wiring layer may be formed by a plating method using the first barrier metal film as a seed layer. In this case, the wiring layer can be formed in such a way that the first barrier metal film is held between the first organic insulating layer and the wiring layer. Thereby, the diffusion of the metal material in the wiring layer into the first organic insulating layer is satisfactorily suppressed.

In the fifth step, the second barrier metal film may be formed by a plating method using the wiring layer as a seed layer. In this case, the second barrier metal film can be selectively formed on the wiring layer, and therefore the steps for manufacturing the organic interposer can be simplified.

In the fourth step, a part of the wiring layer in each of the grooves may be removed, and in the fifth step, the second barrier metal film may be formed in such a way as to be embedded in the grooves. In this case, the second barrier metal film is formed in such a way as to be embedded in each of the grooves, and therefore formation of a step based on the second barrier metal film in the organic interposer can be suppressed. Thereby, a semiconductor device or the like can be satisfactorily mounted on the organic interposer.

According to one aspect of the present invention, an organic interposer having a satisfactory insulation reliability and a method for manufacturing the organic interposer can be provided.

DETAILED DESCRIPTION

Hereinafter, the present embodiment will be described in detail with reference to the accompanying drawings. In the following description, the same reference sign is given to the same or corresponding parts, and overlapped description is omitted. In addition, the relationship of vertical/horizontal positions and the like is based on the positional relationship illustrated in the accompanying drawings unless otherwise noted. Further, dimension ratios in the accompanying drawings are not limited to the ratios illustrated in figures.

In the case where the terms "left", "right", "front surface", "back surface", "upper", "lower", "upward", "downward", "first", "second", and the like are used in the description of the present embodiment and the claims, these terms are intended for description and do not necessarily mean that these relative positions are maintained permanently. In addition, the "layer" and the "film" include not only a structure of a shape formed over the whole surface but also a structure of a shape formed at a part of the whole surface when the "layer" and the "film" are observed as a plan view. Further, not only an independent step but also a step that cannot be clearly distinguished from another step is included in the term "step" as long as the expected purpose of the step can be achieved. Furthermore, in the numerical ranges described in stages in the present specification, an upper limit value or a lower limit value in a numerical range of a certain stage may be replaced with an upper limit value or a lower limit value in a numerical range of another stage.

Figure 1:
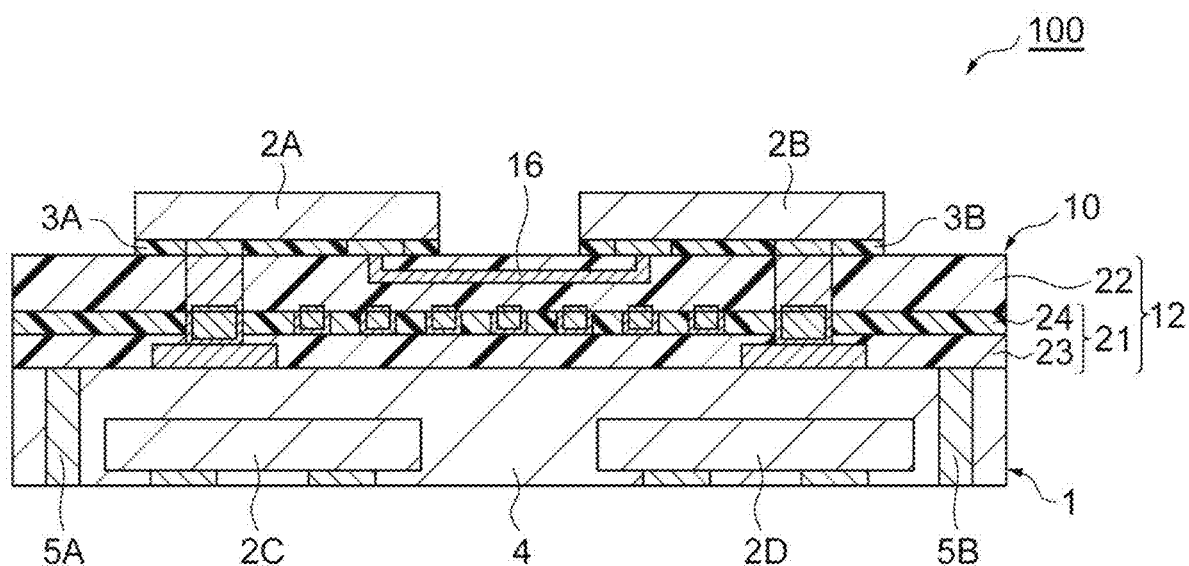
FIG. 1 is a schematic section view of a semiconductor package having an organic interposer according to the present embodiment.

FIG. 1 is a schematic section view of a semiconductor package having an organic interposer according to the present embodiment. It is suitable that the organic interposer of the present disclosure is used for a package form wherein an interposer mounting different kinds of chips is necessary.

As illustrated in FIG. 1, a semiconductor package 100 is an apparatus prepared by mounting semiconductor chips 2A, 2B on an organic interposer 10 provided on a substrate 1. The semiconductor chips 2A, 2B are fixed on the organic interposer 10 by corresponding underfills 3A, 3B respectively and are electrically connected to each other through a surface wire 16 (details will be described later) provided in the organic interposer 10. The substrate 1 is a sealed body formed by sealing semiconductor chips 2C, 2D and electrodes 5A, 5B with an insulating material 4. The semiconductor chips 2C, 2D in the substrate 1 are connectable to an external apparatus through electrodes exposed from the insulating material 4. The electrodes 5A, 5B function as a conduction path for electrically connecting, for example, the organic interposer 10 and an external apparatus to each other.

Each of the semiconductor chips 2A to 2D is, for example, a volatile memory such as a graphic processing unit (GPU), a DRAM (Dynamic Random Access Memory), or an SRAM (Static Random Access Memory), a non-volatile memory such as a flash memory, an RF chip, a silicon photonics chip, MEMS (Micro Electro Mechanical Systems), a sensor chip, or the like. The semiconductor chips 2A to 2D may have a TSV. For example, a semiconductor chip obtained by laminating semiconductor devices can also be used as each of the semiconductor chips 2A to 2D. In this case, semiconductor devices laminated using a TSV can be used. The thickness of the semiconductor chips 2A, 2B is, for example, 200 μm or less. From the viewpoint of thinning the semiconductor package 100, it is preferable that the thickness of the semiconductor chips 2A, 2B be 100 μm or less. In addition, from the viewpoint of handling properties, it is greatly preferable that the thickness of the semiconductor chips 2A, 2B be 30 μm or more.

The underfills 3A, 3B are each, for example, a capillary underfill (CUF), a molded underfill (MUF), a paste underfill (NCP), a film underfill (NCF), or a photosensitive underfill. The underfills 3A, 3B are each constituted using a curable liquid resin (for example, epoxy resin) as a main component. In addition, the insulating material 4 is, for example, a curable resin having insulation properties.

Next, the organic interposer 10 according to the present embodiment will be described in detail using FIG. 2. The organic interposer 10 in the present embodiment is an organic substrate supporting a semiconductor device and the like and is, for example, a build-up substrate obtained by laminating materials (prepregs) of glass cloth or carbon fiber impregnated with a resin, a substrate for a wafer level package, a coreless substrate, a substrate obtained by heat-curing a sealing material, or a substrate obtained by sealing or embedding a chip therein. The shape of the organic interposer 10 depends on the shape of a substrate 11 described later and may be in the form of a wafer (approximately circular shape in planar view) or may be in the form of a panel (approximately rectangular shape in planar view). Note that it is preferable that the coefficient of thermal expansion of the organic interposer 10 be, for example, 40 ppm/° C. or less from the viewpoint of suppressing a warp. It is preferable that the coefficient of thermal expansion be 20 ppm/° C. or less from the viewpoint of insulation reliability of the organic interposer 10.

Figure 2:
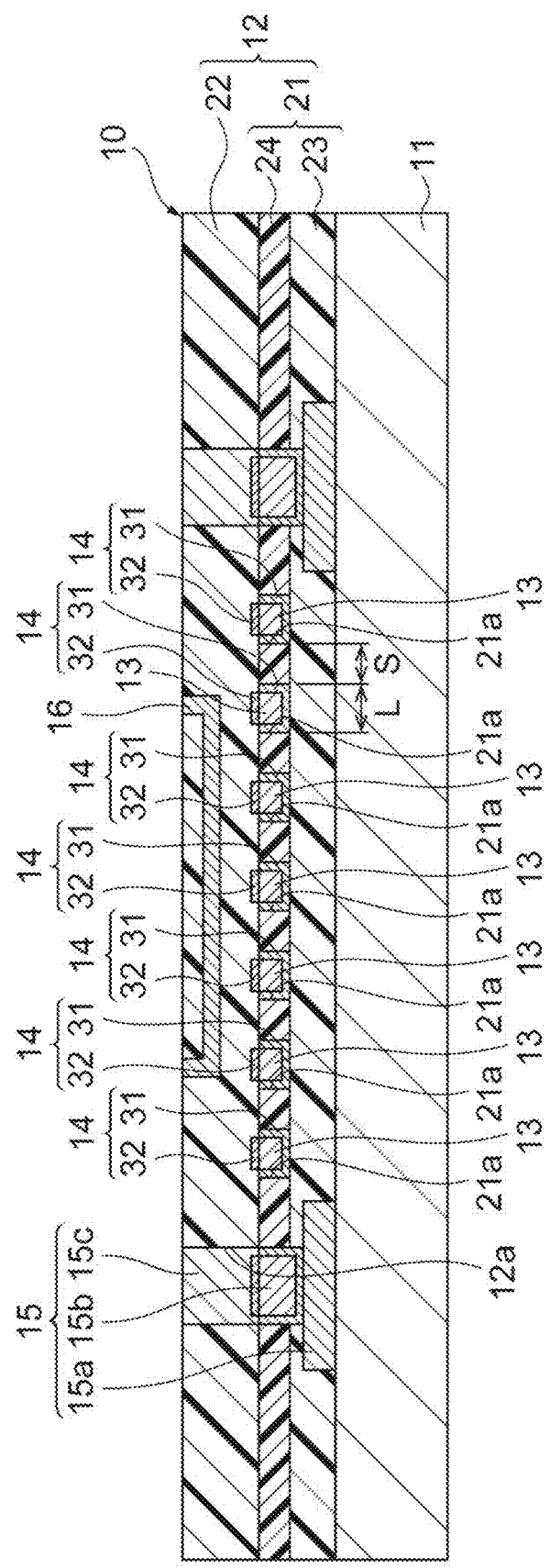
FIG. 2 is a schematic section view of an organic interposer according to the present embodiment.

The organic interposer 10 provided on the substrate 11 illustrated in FIG. 2 comprises: an organic insulating laminate 12 comprising a plurality of organic insulating layers; a plurality of wires 13 arranged in the organic insulating laminate 12; a barrier metal film 14 covering the wires 13; a through wire 15 penetrating the organic insulating laminate 12; and a surface wire 16 formed at the surface and the vicinity of the surface of the organic insulating laminate 12.

The substrate 11 is a support supporting the organic interposer 10. The shape of the substrate 11 in planar view is, for example, a circular shape or a rectangular shape. In the case of the circular shape, the substrate 11 has a diameter of, for example, 200 mm to 450 mm. In the case of the rectangular shape, a side of the substrate 11 has a length of, for example, 300 mm to 700 mm.

The substrate 11 is, for example, a silicon substrate, a glass substrate, or a peelable copper foil. The substrate 11 may be, for example, a build-up substrate, a substrate for a wafer level package, a coreless substrate, a substrate prepared by heat-curing a sealing material, or a substrate obtained by sealing or embedding a chip therein. In the case where a silicon substrate or a glass substrate is used as the substrate 11, a temporary fixing layer temporarily fixing the organic interposer 10 and the substrate 11, the temporary fixing layer not illustrated in the figure, may be provided. In this case, the substrate 11 can be easily released from the organic interposer 10 by removing the temporary fixing layer. Note that the peelable copper foil refers to a laminate wherein a support, a release layer, and a copper foil are stacked in sequence. In the peelable copper foil, the support corresponds to the substrate 11, and the copper foil corresponds to a certain copper wire material contained in the through wire 15.

The organic insulating laminate 12 comprises: a first organic insulating layer 21 having a plurality of grooves 21a wherein the corresponding wires 13 are disposed; and a second organic insulating layer 22 laminated to the first organic insulating layer 21 in such a way as to embed the wires 13. In addition, a plurality of openings 12a wherein the through wire 15 is to be provided are provided in the organic insulating laminate 12.

The plurality of grooves 21a are provided in a surface opposite to the substrate 11 in the first organic insulating layer 21. In a section taken along a direction orthogonal to an extending direction of the grooves 21a, each of the grooves 21a has an approximately rectangular shape. Therefore, the inner surface of each of the grooves 21a has side surfaces and a bottom surface. In addition, the plurality of grooves 21a have a predetermined line width L and a predetermined space width S. Each of the line widths L and the space width S is, for example, 0.5 μm to 10 μm, preferably 0.5 μm to 5 μm, and more preferably 2 μm to 5 μm. From the viewpoint of realizing a high-density transmission of the organic interposer 10, it is preferable that the line width L be 1 μm to 5 μm. The line width L and the space width S may be set to be the same with each other or may be set to be different from each other. The line width L corresponds to the width of the grooves 21a in a direction orthogonal to the extending direction of the grooves 21a in planar view. The space width S corresponds to the distance between the grooves 21a adjacent to each other. The depth of the grooves 21a corresponds to, for example, the thickness of the fourth organic insulating layer 24 described later.

It is preferable that the surface roughness of the inner surfaces in the grooves 21a be 0.01 μm to 0.1 μm. In the case where this surface roughness is 0.01 μm or more, the adhesiveness of an object to be closely contact with the first organic insulating layer 21 in the grooves 21a, and temperature-cycle resistance thereof become satisfactory. In the case where the surface roughness is 0.1 μm or less, there is a tendency that the short circuit of the wires 13 can be suppressed and high-frequency properties of the wires 13 can be improved. The surface roughness of the inner surfaces in the grooves 21a is calculated, for example, by observing a section of the grooves 21a with an electron microscope. Note that the surface roughness refers to the arithmetic average roughness (Ra) specified by JIS B 0601 2001, and the "surface roughness" hereinafter refers to the "surface roughness Ra" in all cases. The temperature-cycle resistance refers to resistance against a change in volume, degradation in performance, breakage, and the like accompanied by temperature changes.

The first organic insulating layer 21 is provided between the substrate 11 and the second organic insulating layer 22. The storage modulus of the first organic insulating layer 21 at room temperature is, for example, 500 MPa to 10 GPa. When the storage modulus is 500 MPa or more, elongation of the first organic insulating layer 21 during grinding can be suppressed. Thereby, for example, covering of the wires 13 in the grooves 21a with an elongated resin material can be prevented. In addition, when the storage modulus is 10 GPa or less, for example, breakage of a grinding edge can be prevented and, as a result, enlargement of the surface roughness of the first organic insulating layer 21 and the like can be suppressed. Note that the "room temperature" refers to a temperature of around 25° C.

The first organic insulating layer 21 comprises: a third organic insulating layer 23 positioned on the side of the substrate 11; and a fourth organic insulating layer 24 positioned on the side of the second organic insulating layer 22. A plurality of openings corresponding to the grooves 21a are provided at a part of the fourth organic insulating layer 24. The surface of the third organic insulating layer 23 exposed by these openings constitutes the bottom surface in the inner surfaces of the grooves 21a. In addition, each side surface in the inner surfaces of the grooves 21a is constituted by the fourth organic insulating layer 24.

The thickness of the third organic insulating layer 23 and of the fourth organic insulating layer 24 are each, for example, 0.5 μm to 10 μm. Therefore, the thickness of the first organic insulating layer 21 is, for example, 1 μm to 20 μm. When the thickness of the first organic insulating layer 21 is 1 μm or more, the first organic insulating layer 21 contributes to stress relaxation of the organic insulating laminate 12, and the temperature-cycle resistance of the organic insulating laminate 12 can be improved. When the thickness of the first organic insulating layer 21 is 20 μm or less, the warp of the organic insulating laminate 12 can be suppressed, and the wires and the like can be exposed easily in, for example, grinding the organic insulating laminate 12. From the viewpoint of forming the wires 13 having a width of 3 μm or less by performing exposure and development, it is preferable that the thickness of the first organic insulating layer 21 be 15 μm or less, more preferably 10 μm or less.

Each of the first organic insulating layer 21 and the second organic insulating layer 22 in the organic insulating laminate 12 is, for example, in the form of liquid or a film and contains an insulating material having curability. From the viewpoint of flatness and manufacturing costs of the organic insulating layers, a film-formed material (organic insulating material) is preferable. In this case, even when the surface roughness of the substrate 11 is, for example, 300 μm or more, the surface roughness of the organic insulating laminate 12 can be reduced. In addition, it is preferable that the film-formed organic insulating material can be laminated at 40° C. to 120° C. By setting the temperature enabling lamination at 40° C. or more, it can be suppressed to make the tack (tackiness) of the organic insulating material at room temperature strong, and satisfactory handling properties can be maintained. By setting the temperature enabling lamination at 120° C. or less, the occurrence of the warp in the organic insulating laminate 12 can be suppressed.

The coefficient of thermal expansion of the organic insulating material after curing is, for example, 80 ppm/° C. or less from the viewpoint of suppressing the warp of the organic insulating layers (and organic insulating laminate 12). From the viewpoint of insulation reliability of the organic interposer 10, it is preferable that the coefficient of thermal expansion be 70 ppm/° C. or less. In addition, from the viewpoint of stress relaxation performance and processing accuracy of the organic insulating material, it is greatly preferable that the coefficient of thermal expansion be 20 ppm/° C. or more.

It is preferable that the organic insulating material be a photosensitive organic insulating material (photosensitive insulating resin) from the viewpoint of ease of processing and processing accuracy. It is greatly preferable that this photosensitive insulating resin be a negative type photosensitive insulating resin from the viewpoint of heat resistance and ease of handling. A photo radical initiating material or a photoacid generator can be contained in a photo-curing insulating resin, but it is preferable that the photoacid generator be contained from the viewpoint of ease of fine processing. From the above-described viewpoints, it is most preferable that the organic insulating layer be a negative type photosensitive insulating resin film containing a photoacid generator.

The photoacid generator is not particularly limited as long as the photoacid generator is a compound generating an acid by light irradiation. From the viewpoint of efficiently generating an acid, it is preferable that the photoacid generator be, for example, an onium salt compound or a sulfonimide compound. Examples of the onium salt compound include iodonium salts or sulfonium salts. Specific examples of the onium salt compound include diaryliodonium salts such as diphenyliodonium trifluoromethanesulfonate, diphenyliodonium p-toluenesulfonate, diphenyliodonium hexafluoroantimonate, diphenyliodonium hexafluorophosphate, and diphenyliodonium tetrafluoroborate; triarylsulfonium salts such as triphenylsulfonium trifluoromethanesulfonate, triphenylsulfonium p-toluenesulfonate, and triphenylsulfonium hexafluoroantimonate; 4-tert-butylphenyl-diphenylsulfonium p-toluenesulfonate, and 4,7-di-n-butoxynaphthyl tetrahydrothiophenium trifluoromethanesulfonate. Specific examples of the sulfonimide compound include N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy) bicyclo[2.2.1]hept-5-ene-2,3-dicarboxyimide, N-(trifluoromethylsulfonyloxy)napthalimide, N-(p-toluenesulfonyloxy)-1,8-naphthalimide, and N-(10-camphorsulfonyloxy)-1,8-napthalimide.

From the viewpoint of resolution, a compound having a trifluoromethanesulfonate group, a hexafluoroantimonate group, a hexafluorophosphate group, or a tetrafluoroborate group may be used as the photoacid generator.

It is preferable that the photosensitive insulating resin be soluble to an aqueous solution containing 2.38 mass % of tetramethylammonium. From the viewpoint of resolution, storage stability, and insulation reliability of the photosensitive insulating resin, it is preferable that the photosensitive insulating resin contain a phenolic hydroxy group-containing compound. Examples of the phenolic hydroxy group-containing compound include phenol/formaldehyde condensation novolak resins, cresol/formaldehyde condensation novolak resins, phenol-naphthol/formaldehyde condensation novolak resins, polyhydroxystyrene and polymerized products thereof, phenol-xylylene glycol condensation resins, cresol-xylylene glycol condensation resins, and phenol-dicyclopentadiene condensation resins.

It is preferable that the photosensitive insulating resin comprise a thermosetting resin. Examples of the thermosetting resin include acrylate resins, epoxy resins, cyanate ester resins, maleimide resins, allylnadiimide resins, phenol resins, urea resins, melamine resins, alkyd resins, unsaturated polyester resins, diallyl phthalate resins, silicone resins, resorcinol formaldehyde resins, triallyl cyanurate resins, polyisocyanate resins, resins containing tris(2-hydroxyethyl) isocyanurate, resins containing triallyl trimellitate, and thermosetting resins synthesized from cyclopentadiene. From the viewpoint of resolution and insulation reliability of the photosensitive insulating resin and adhesiveness of the photosensitive insulating resin with a metal, it is greatly preferable that the thermosetting resin be a compound having any of a methylol group, an alkoxyalkyl group, and a glycidyl group.

From the above-described viewpoints, it is most preferable that each of the first organic insulating layer 21 and the second organic insulating layer 22 be a cured film prepared by curing a photosensitive organic insulating resin comprising: a photoacid generator; a phenolic hydroxy group-containing compound; and a thermosetting resin. Note that each of the first organic insulating layer 21 and the second organic insulating layer 22 may contain a filler. From the viewpoint of ease of processing and processing accuracy, the average particle diameter of the filler is, for example, 500 nm or less. It is preferable that the content of the filler in the first organic insulating layer 21 (or second organic insulating layer 22) be less than 1 mass %. In addition, it is greatly preferable that the first organic insulating layer 21 and the second organic insulating layer 22 not contain a filler.

The plurality of wires 13 are provided in the corresponding grooves 21a as described above and each function as a conduction path inside the organic interposer 10. Therefore, the width of the wires 13 is approximately coincident with the line width L of the grooves 21a, and the interval between the adjacent wires 13 is approximately coincident with the space width S of the grooves 21a. From the viewpoint of satisfactorily exhibiting the function as a conduction path, it is preferable that the wires 13 contain a metal material having a high electrical conductivity. The metal material having a high electrical conductivity is, for example, copper, aluminum, or silver. These metal materials are likely to diffuse into the organic insulating laminate 12 by heating. From the viewpoint of electrical conductivity and costs, it is preferable that the metal material contained in the wires 13 be copper.

The barrier metal film 14 is a metal film provided to separate each of the wires 13 from the first organic insulating layer 21 and the second organic insulating layer 22. The barrier metal film 14 comprises: a first barrier metal film 31 provided between each of the wires 13 and the inner surface of each of the grooves 21a; and a second barrier metal film 32 provided between each of the wires 13 and the second organic insulating layer 22. Therefore, the first barrier metal film 31 is provided to separate each of the wires 13 and the inner surface of each of the grooves 21a (namely, first organic insulating layer 21). In addition, the second barrier metal film 32 is provided to separate each of the wires 13 and the second organic insulating layer 22.

The first barrier metal film 31 is an electrically conductive film for preventing the diffusion of the metal material in the wires 13 into the first organic insulating layer 21 and is formed along the inner surface of each of the grooves 21a. The first barrier metal film 31 comprises, for example, at least one of titanium, nickel, palladium, chromium, tantalum, tungsten, and gold as a metal material hardly diffusing into the organic insulating layer. From the viewpoint of adhesiveness to the inner surface of each of grooves 21a, it is preferable that the first barrier metal film 31 be a titanium film or an alloy film containing titanium. In addition, from the viewpoint of forming the first barrier metal film 31 by sputtering, it is preferable that the first barrier metal film 31 be a titanium film, a tantalum film, a tungsten film, a chromium film, or an alloy film containing at least any of titanium, tantalum, tungsten, and chromium.

The thickness of the first barrier metal film 31 is less than a half of the width of the grooves 21a and less than the depth of the grooves 21a, and is, for example, 0.001 µm to 0.5 µm. From the viewpoint of preventing the diffusion of the metal material in the wires 13, it is preferable that the thickness of the first barrier metal film 31 be 0.01 µm to 0.5 µm. In addition, from the viewpoint of flatness of the first barrier metal film 31 and of making the quantity of a current flowing in the wires 13 large, it is preferable that the thickness of the first barrier metal film 31 be 0.001 µm to 0.3 µm. From those described above, it is most preferable that the thickness of the first barrier metal film 31 be 0.01 µm to 0.3 µm.

The second barrier metal film 32 is an electrically conductive film for preventing the diffusion of the metal material in the wires 13 into the second organic insulating layer 22 and is formed to cover the wires 13. The second barrier metal film 32 comprises, for example, at least one of titanium, nickel, palladium, chromium, tantalum, tungsten, cobalt, and gold as a metal material hardly diffusing into the organic insulating layer. Note that the second barrier metal film 32 may be a laminate of different metal films.

It is preferable that the second barrier metal film 32 be a plated film (for example, electrolessly plated film) using the wires 13 as a seed layer. Therefore, it is preferable that the second barrier metal film 32 be a nickel-plated film, a palladium-plated film, a cobalt-plated film, a gold-plated film, or an alloy-plated film containing at least one of nickel, palladium, cobalt, and gold. From the viewpoint of adhesiveness to the wires 13 and temperature-cycle resistance, it is preferable that the second barrier metal film 32 be a nickel-plated film or a palladium-plated film.

Examples of the nickel-plated film include an electrolessly nickel-phosphorus alloy-plated film containing phosphorus, an electrolessly nickel-boron alloy-plated film containing boron, or an electrolessly nickel-nitrogen alloy-plated film containing nitrogen. It is preferable that the nickel content in the nickel-plated film be 80 mass % or more. When the nickel content is 80 mass % or more, an effect of improving the insulation reliability of the organic interposer 10 by the second barrier metal film 32 is satisfactorily exhibited. It is preferable that the nickel-plated film be an electrolessly nickel-phosphorus alloy-plated film from the viewpoint of insulation reliability.

It is preferable that the second barrier metal film 32 be an electrolessly palladium-plated film from the viewpoint of obtaining a satisfactory insulation reliability at a thickness of 0.1 µm or less. Examples of the electrolessly palladium-plated film include a substituted palladium-plated film, an electrolessly palladium-plated film using a formic acid compound as a reducing agent, a palladium-phosphorus alloy-plated film using hypophosphoric acid, phosphorous acid, or the like as a reducing agent, or a palladium-boron alloy-plated film using a boron compound.

The thickness of the second barrier metal film 32 is, for example, 0.001 µm to 1 µm. From the viewpoint of yield of the second barrier metal film 32, it is preferable that the thickness of the second barrier metal film 32 be 0.01 µm to 1 µm. In addition, from the viewpoint of improving yield cycle time of the second barrier metal film 32, thinning the second barrier metal film 32, and temperature-cycle resistance of the second barrier metal film 32, it is greatly preferable that the thickness of the second barrier metal film be 0.001 µm to 0.5 µm. From the viewpoint of thinning the second barrier metal film 32 and resolution of the photo-sensitive insulating resin, it is further greatly preferable that the thickness of the second barrier metal film be 0.001 µm to 0.3 µm. From the above-described viewpoints, it is most preferable that the thickness of the second barrier metal film 32 be 0.01 µm to 0.3 µm.

The surface roughness Ra of the second barrier metal film 32 is affected by the surface roughness of the wires 13 and is, for example, 0.01 µm to 1 µm. In the case where the surface roughness Ra of the second barrier metal film 32 is 0.01 µm or more, the adhesiveness between the second barrier metal film 32 and the second organic insulating layer 22 and the reliability such as the temperature-cycle resistance can be secured. In the case where the surface roughness Ra of the second barrier metal 32 is 1 µm or less, disconnection and the like in the organic interposer 10 based on unevenness generated during formation of the second organic insulating layer 22 can be suppressed, and lowering of the resolution of the organic insulating laminate 12 can be suppressed. From the viewpoint of adhesiveness to the second organic insulating layer 22, it is preferable that the surface roughness Ra of the second barrier metal film 32 be 0.03 µm or more. From the viewpoint of temperature-cycle resistance, it is preferable that the surface roughness Ra of the second barrier metal film 32 be 0.5 µm or less. From the viewpoint of high-frequency properties, it is greatly preferable that the surface roughness Ra of the second barrier metal film 32 be 0.1 µm or less. From the above-described viewpoints, it is most preferable that the surface roughness Ra of the second barrier metal film 32 be 0.03 µm to 0.1 µm.

In the organic interposer 10, the surface roughness Ra of the surface made by the first organic insulating layer 21 (namely, fourth organic insulating layer 24) and the second barrier metal film 32 is, for example, 0.01 µm to 1 µm. When the surface roughness Ra of the surface is 0.01 µm or more, the adhesiveness of the first organic insulating layer 21 (and second barrier metal film 32) with the second organic insulating layer 22 becomes satisfactory. In addition, when the surface roughness Ra of the surface is 1 µm or less, the warp of the organic insulating laminate 12 can be suppressed, and the wires and the like can be easily exposed in, for example, grinding the organic insulating laminate 12. The surface roughness Ra of the surface is calculated, for example, by scanning a range of 100 µm×100 µm, the range including the first organic insulating layer 21 and the second barrier metal film 32, using a laser microscope ("LEXT OLS3000", manufactured by Olympus Corporation).

The surface roughness Ra of the surface made by the first organic insulating layer 21 and the second barrier metal film 32 can be controlled by flattening the wires 13 and the first organic insulating layer 21. Examples of the flattening treatment on the surface include a chemical mechanical polishing method (CMP) or a fly-cutting method. From the viewpoint of suppressing occurrence of dishing to the wires 13, it is preferable to use the fly-cutting method. Note that the fly-cutting method refers to a method of physically grinding an object using a grinding apparatus such as a surface planer.

The through wire 15 is a wire embedded in the opening 12a of the organic insulating laminate 12 and functions as a connecting terminal to an external apparatus. The through wire 15 is configured by a plurality of wiring layers 15a to 15c laminated to each other. The wiring layer 15b comprises: a wiring layer formed simultaneously with the wires 13; and a metal film formed simultaneously with the barrier metal film 14.

The surface wire 16 is a wire for electrically connecting semiconductor chips each mounted on the organic interposer 10. Therefore, both the terminal portions of the surface wire 16 are exposed from the organic interposer 10, and the surface wire 16 other than both the terminal portions are embedded in the organic interposer 10 (more specifically, second organic insulating layer 22). Therefore, the second organic insulating layer 22 comprises at least two organic insulating layers.

Next, the method for manufacturing the organic interposer 10 according to the present embodiment is described with reference to FIG. 3A to FIG. 10B. The organic interposer 10 formed by the following manufacturing method is particularly suitable, for example, in the form wherein micronization and an increase in the number of pins are considered to be necessary. Note that FIG. 4B is an enlarged diagram of a part of FIG. 4A. Similarly, each of FIGS. 5B, 6B, 7B, 8B, and 9B is an enlarged diagram of a part of the corresponding drawing.

Figure 3A:
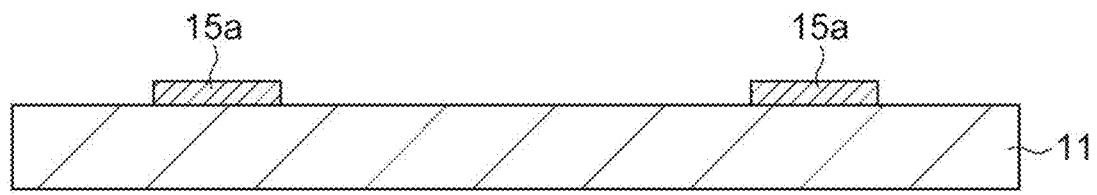
FIGS. 3A to 3C respectively illustrate a diagram describing a method for manufacturing an organic interposer.

Firstly, as step 1, the wiring layer 15a is formed on the substrate 11 as illustrated in FIG. 3A. The wiring layer 15a is formed by patterning a metal film formed on the substrate 11. In step 1, the metal film is formed, for example, by a coating method, a physical vapor deposition method (PVD method) such as a vacuum deposition or sputtering, a printing method or a spraying method using a metal paste, or various plating methods. In the present embodiment, a copper foil is used as the metal film.

Note that in the case where a temporary fixing layer (not illustrated in figure) is provided between the substrate 11 and the wiring layer 15a, the temporary fixing layer contains, for example, polyimide, polybenzoxazole, a resin containing a nonpolar component such as silicon or fluorine, a resin containing a component undergoing volume expansion or foaming by heating or UV (ultraviolet ray), a resin containing a component allowing cross-linking reaction to occur by heating or UV, or a resin generating heat by light irradiation. Examples of the method of forming the temporary fixing layer include spin coating, spray coating, or laminating. From the viewpoint of achieving both handling properties and carrier releasability at a high level, it is preferable that the temporary fixing layer become easy to release by external stimulation such as light or heat. From the viewpoint of making the temporary fixing layer releasable in such a way as not to be left in the organic interposer 10 to be manufactured later, it is most preferable that the temporary fixing layer contain a resin undergoing volume expansion by heat treatment.

In the case where the temporary fixing layer is provided between the substrate 11 and the wiring layer 15a, the wiring layer 15a may be formed from a copper foil of a peelable copper foil. In this case, the substrate 11 corresponds to the support of the peelable copper foil, and the temporary fixing layer corresponds to the release layer of the peelable copper foil.

Figure 3B:
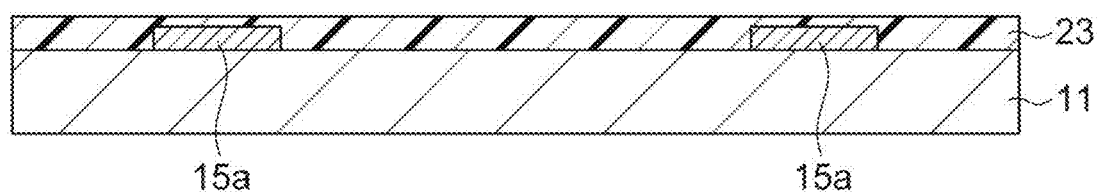

Next, as step 2, the third organic insulating layer 23 is formed on the substrate 11 to cover the wiring layer 15a as illustrated in FIG. 3B. In step 2, the wiring layer 15a is covered by sticking a film-formed third organic insulating layer 23 containing a negative type photosensitive insulating resin to the substrate 11. Subsequently, an exposure treatment, a development treatment, a curing treatment, or the like is performed as necessary on the third organic insulating layer 23.

Figure 3C:
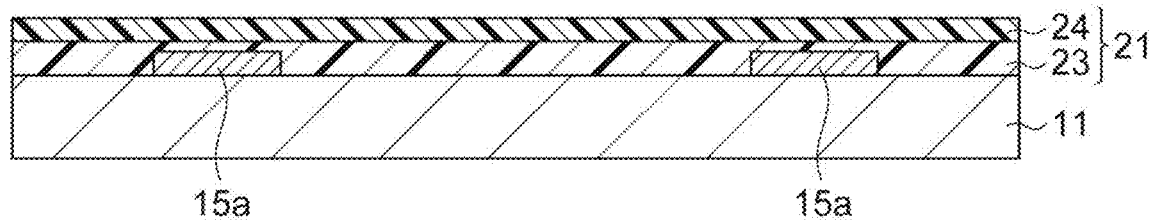

Next, as step 3, the first organic insulating layer 21 is formed by forming the fourth organic insulating layer 24 on the third organic insulating layer 23 as illustrated in FIG. 3C. In step 3, a film-formed fourth organic insulating layer 24 containing a negative type photosensitive insulating resin is attached to the third organic insulating layer 23 in the same manner as in the step 2. Subsequently, an exposure treatment, a development treatment, a curing treatment, or the like is performed as necessary on the fourth organic insulating layer 24.

Figure 4A:
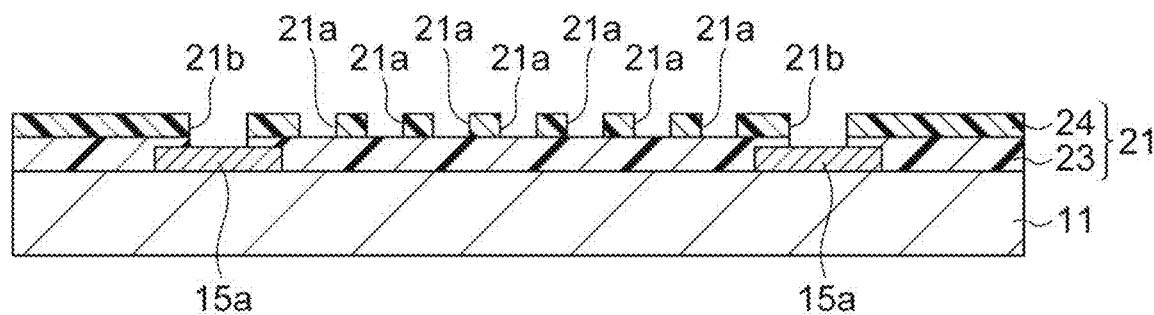
FIGS. 4A and 4B respectively illustrate a diagram describing a method for manufacturing an organic interposer.
Figure 4B:
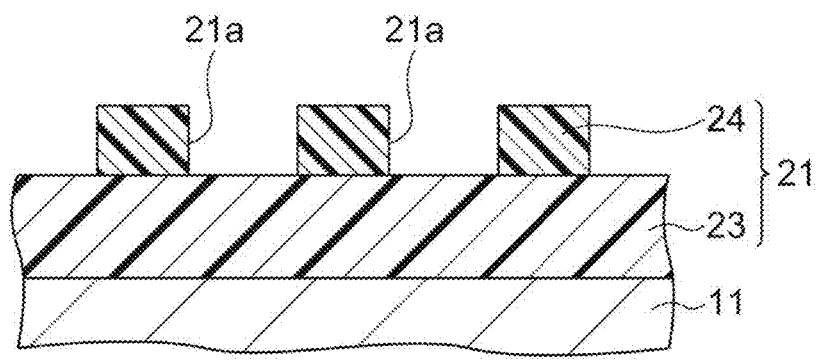

Next, as step 4, the plurality of grooves 21a and openings 21b are formed in the first organic insulating layer 21 (also referred to as first step) as illustrated in FIGS. 4A and 4B. In step 4, the plurality of grooves 21a and openings 21b are formed, for example, by laser abrasion, photolithography, or imprint. From the viewpoint of micronization of the grooves 21a and costs for forming the grooves 21a, it is preferable to adopt photolithography. Therefore, the plurality of grooves 21a are formed by performing an exposure treatment and a development treatment on the first organic insulating layer 21. In addition, the openings 21b are formed to expose the wiring layer 15a. Note that in the case where a photosensitive insulating resin is used in the first organic insulating layer 21, the pattern for the grooves 21a can be formed flatly in a short time. Therefore, the wires described later can be made excellent in high-frequency properties.

As a method for exposing a photosensitive insulating resin in the photolithography, a publicly known projection exposure system, contact exposure system, direct exposure system or the like can be used. In addition, for example, an alkaline aqueous solution of sodium carbonate, TMAH, or the like may be used for developing a photosensitive insulating resin.

In step 4, the first organic insulating layer 21 may be further heated and cured after the plurality of grooves 21a and openings 21b are formed. In this case, for example, the first organic insulating layer 21 is heated and cured by setting the heating temperature to 100 to 200° C. and setting the heating time to 30 minutes to 3 hours.

Figure 5A:
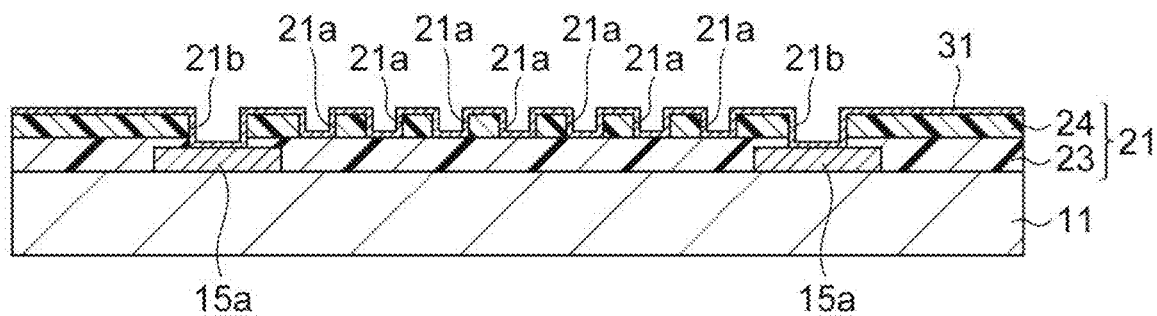
FIGS. 5A and 5B respectively illustrate a diagram describing a method for manufacturing an organic interposer.
Figure 5B:
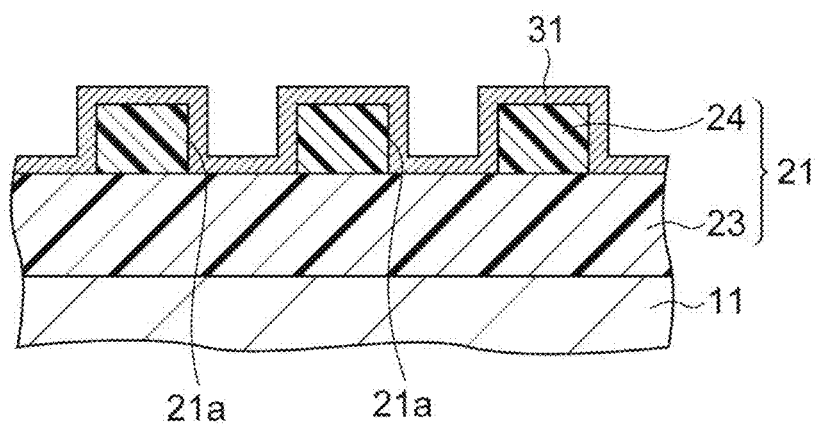

Next, as step 5, the first barrier metal film 31 is formed on the first organic insulating layer 21 to cover the inner surfaces of the grooves 21a (also referred to as second step) as illustrated in FIGS. 5A and 5B. In step 5, the first barrier metal film 31 is formed, for example, by a coating method, a PVD method, a printing method or a spraying method using a metal paste, or various plating methods. In the case of the coating method, the first barrier metal film 31 is formed by applying a palladium or nickel complex on the first organic insulating layer 21 and then heating the complex. In the case of using a metal paste, the first barrier metal film 31 is formed by applying the paste containing a metal particle of nickel, palladium, or the like on the first organic insulating layer 21 and then sintering the paste. In the present embodiment, the first barrier metal film 31 is formed by sputtering being one of the PVD methods. Note that the first barrier metal film 31 is formed to cover the inner surfaces of the openings 21b as well.

Figure 6A:
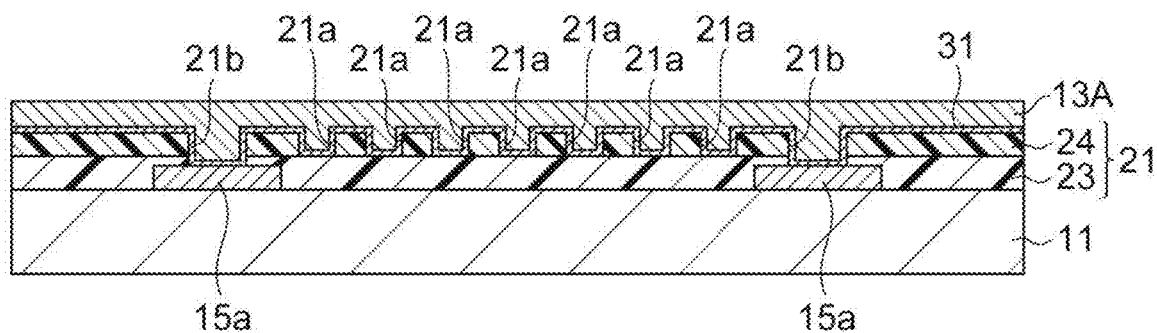
FIGS. 6A and 6B respectively illustrate a diagram describing a method for manufacturing an organic interposer.
Figure 6B:
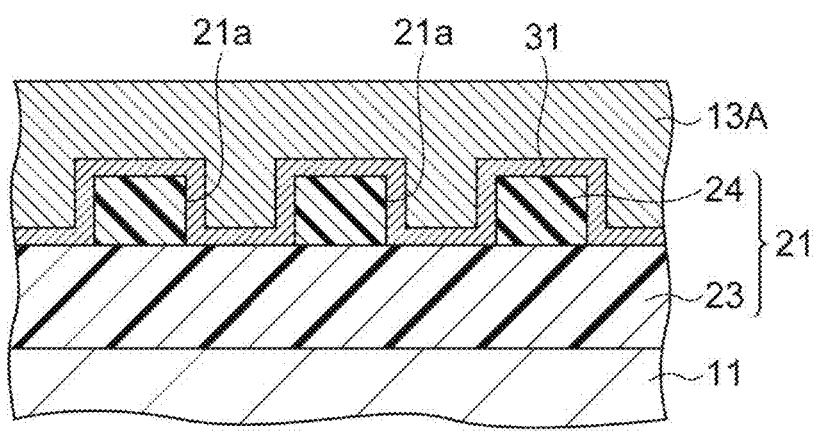

Next, as step 6, the wiring layer 13A is formed on the first barrier metal film 31 to embed the grooves 21a (also referred to as third step) as illustrated in FIGS. 6A and 6B. In step 6, the wiring layer 13A is formed, for example, by a method using a metal paste, or a plating method using the first barrier metal film 31 as a seed layer. It is preferable that the thickness of the wiring layer 13A be 0.5 to 3 times the thickness of the first organic insulating layer 21. In the case where the thickness of the wiring layer 13A is 0.5 times the thickness of the first organic insulating layer 21 or more, there is a tendency that enlargement of the surface roughness Ra of the wires 13 formed in the later step can be suppressed. In addition, the thickness of the wiring layer 13A is three times the thickness of the first organic insulating layer 21 or less, there is a tendency that the warp of the wiring layer 13A is suppressed and the wiring layer 13A is closely contact with the first organic insulating layer 21 to a satisfactory level. Note that the wiring layer 13A is formed to embed the openings 21b as well.

Figure 7A:
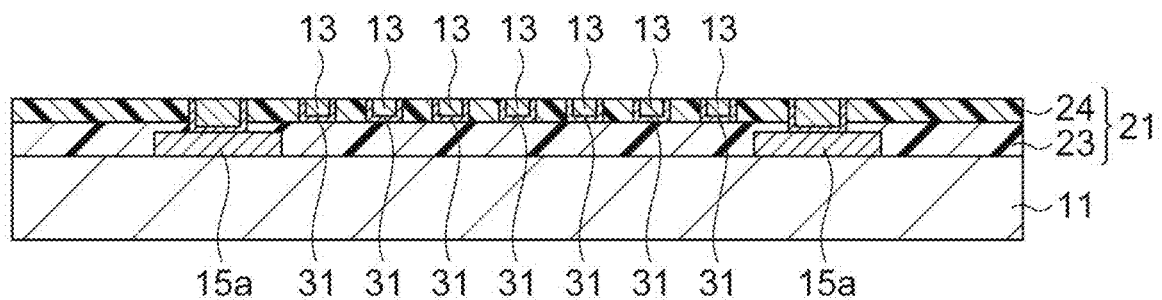
FIGS. 7A and 7B respectively illustrate a diagram describing a method for manufacturing an organic interposer.
Figure 7B:
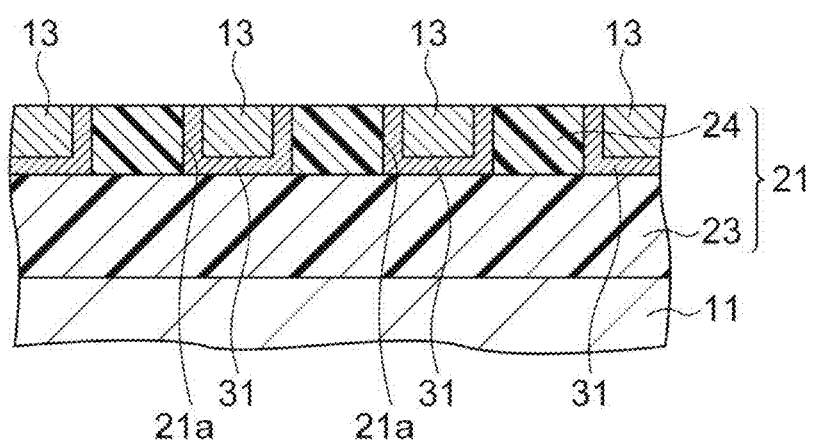

Next, as step 7, the wiring layer 13A is thinned to expose the first organic insulating layer 21 (also referred to as fourth step) as illustrated in FIGS. 7A and 7B. In step 7, the first organic insulating layer 21 is exposed, and the wiring layer 13A is thinned by removing a portion outside the grooves 21a and outside the openings 21b in the wiring layer 13A, and by removing a portion not covering the grooves 21a or openings 21b in the first barrier metal film 31. Thereby, the wires 13 embedded in the grooves 21a are formed. This thinning treatment may be replaced with a flattening treatment on the surface made by the first organic insulating layer 21 and the wires 13. In this case, the flattening is performed by removing a target portion in the wiring layer 13A and the first barrier metal film 31 and by polishing or grinding the surface of the first organic insulating layer 21 through the CMP or fly-cutting method.

In the case where the CMP is used in step 7, for example, a slurry wherein alumina is blended, the slurry generally used for polishing a resin; a slurry wherein hydrogen peroxide and silica are blended, the slurry for use in polishing the first barrier metal film 31; and a slurry wherein hydrogen peroxide and ammonium persulfate are blended, the slurry for use in polishing the wiring layer 13A, are used. From the viewpoint of reducing costs and controlling the surface roughness Ra to be 0.01 μm to 1 μm, it is preferable to grind the first organic insulating layer 21, the first barrier metal film 31, and the wiring layer 13A (wires 13) using the slurry wherein alumina is blended. In the case where the CMP is used, there is a tendency that costs become high. In addition, in the case where the first organic insulating layer 21, the first barrier metal film 31, and the wiring layer 13A (wires 13) are simultaneously flattened, dishing occurs to the wires 13 due to differences in polishing speed, and as a result, there is a tendency that the flatness of the surface made by the first organic insulating layer 21 and the wires 13 is remarkably deteriorated. Therefore, from the viewpoint of making the surface roughness Ra of the surface 0.03 μm to 0.1 μm, it is greatly preferable that the first organic insulating layer 21, the first barrier metal film 31, and the wiring layer 13A (wires 13) be ground by a fly-cutting method using a surface planer.

Figure 8A:
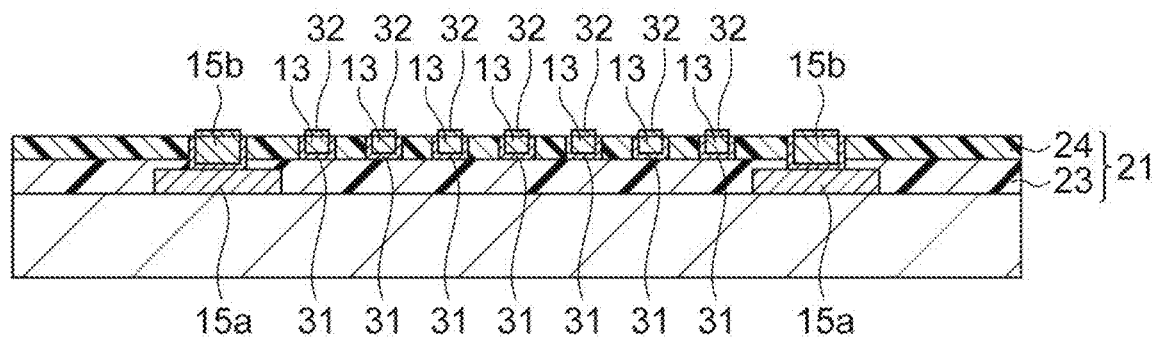
FIGS. 8A and 8B respectively illustrate a diagram describing a method for manufacturing an organic interposer.
Figure 8B:
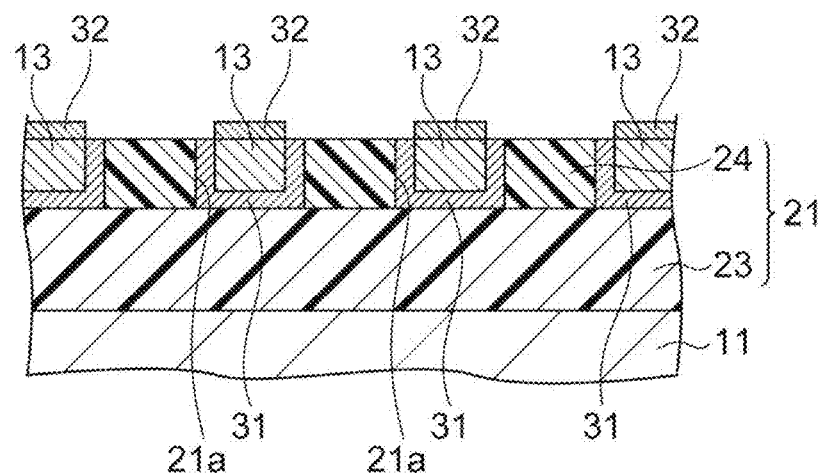

Next, as step 8, the second barrier metal film 32 is formed to cover the wires 13 being the wiring layer 13A in the grooves 21a (also referred to as fifth step) as illustrated in FIGS. 8A and 8B. In step 8, the second barrier metal film 32 is formed, for example, by a PVD method, a method using a metal paste, or a plating method using the wires 13 as a seed layer. From the viewpoint of forming the second barrier metal film 32 on the wires 13 with a satisfactory selectivity, it is preferable that the second barrier metal film 32 be formed by a plating method using the wires 13 as a seed layer. Note that cleaning of the exposed first organic insulating layer 21 with an acid or a treatment for protecting the exposed first organic insulating layer 21 with benzotriazole or the like may be performed before the plating treatment. Note that the wiring layer 15b to be provided on the wiring layer 15a is completed through step 8.

In step 8, it is preferable that the second barrier metal film 32 be formed on the wires 13, and besides, on portions each being in contact with a side surface of each of the grooves 21a in the first barrier metal film 31. In this case, the wires 13 can be covered without any gap by the first barrier metal film 31 and the second barrier metal film 32.

Figure 9A:
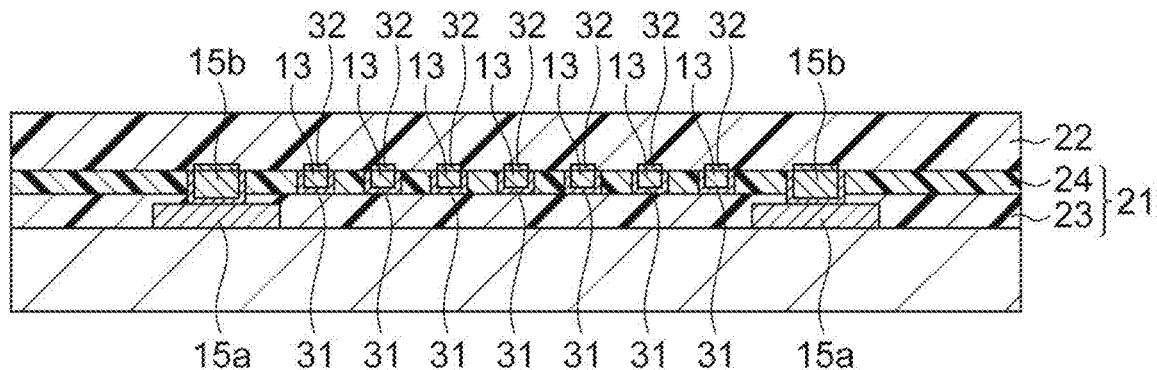
FIGS. 9A and 9B respectively illustrate a diagram describing a method for manufacturing an organic interposer.
Figure 9B:
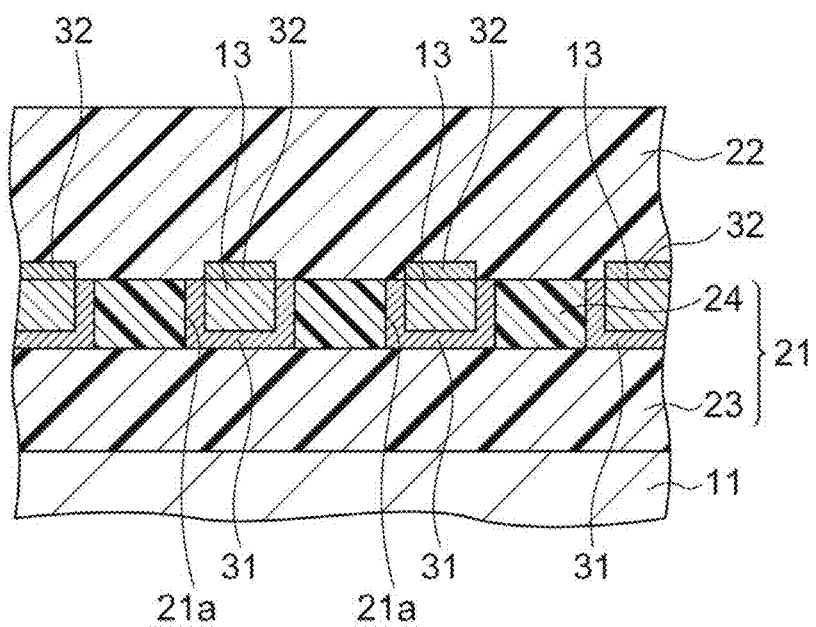

Next, as step 9, the second organic insulating layer 22 is formed on the first organic insulating layer 21 and the second barrier metal film 32 (also referred to as sixth step) as illustrated in FIGS. 9A and 9B. In step 9, a film-formed second organic insulating layer 22 containing a negative type photosensitive insulating resin is attached to the first organic insulating layer 21 and the second barrier metal film 32. The second organic insulating layer 22 may be the same film as the first organic insulating layer 21 or may be formed using a different photosensitive insulating resin. From the viewpoint of preventing the diffusion of the metal constituting the wires 13, it is preferable not to perform a development treatment on the second organic insulating layer 22.

Figure 10A:
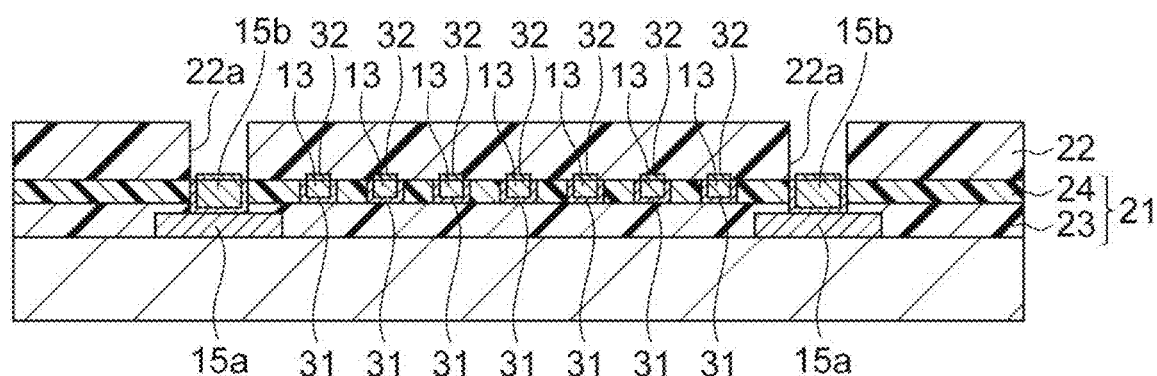
FIGS. 10A and 10B respectively illustrate a diagram describing a method for manufacturing an organic interposer.

Next, as step 10, openings 22a are formed in the second organic insulating layer 22 as illustrated in FIG. 10A. In step 10, the openings 22a are formed to expose the wiring layer 15b. The openings 22a are formed, for example, by photolithography or the like.

Figure 10B:
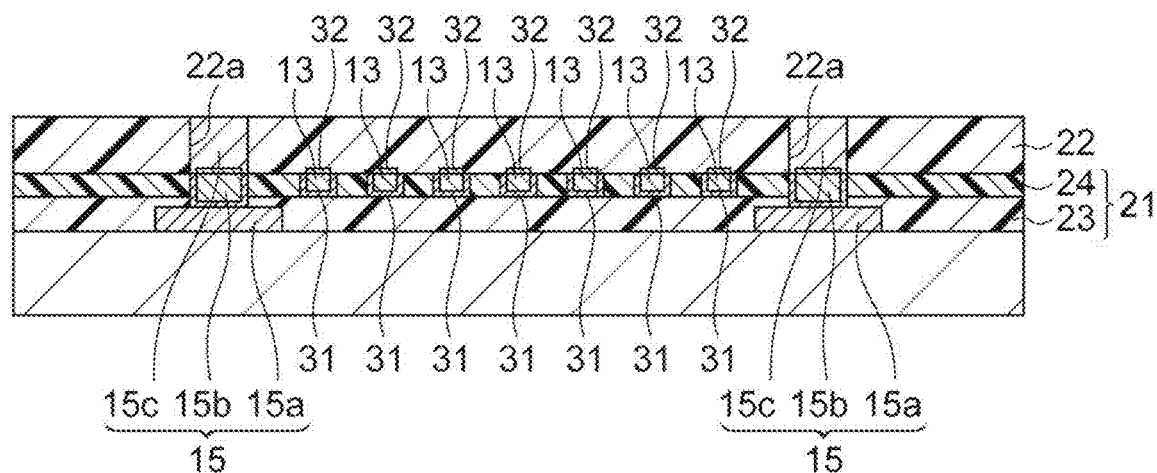

Next, as step 11, the through wires 15 are formed by filling the metal material in the openings 22a and forming the wiring layer 15c as illustrated in FIG. 10B. In step 11, the wiring layer 15c is formed, for example, by a PVD method or various plating methods. Examples of the metal material include copper, nickel, tin and the like. After step 11 is completed, the organic interposer 10 illustrated in FIG. 2 is manufactured by forming the surface wire 16 and the like. Note that in the case where a temporary fixing layer is provided, the organic interposer 10 may be released from the substrate 11.

According to the organic interposer 10 having the constitution described above, each of the wires 13 is separated from the first organic insulating layer 21 and the second organic insulating layer 22 by the barrier metal film 14. Therefore, the diffusion of the metal material in the wires 13 into the organic insulating laminate is suppressed by the barrier metal film 14. Accordingly, the short circuit between a plurality of wires 13 through the diffused metal material can be suppressed, and therefore the insulation reliability of the organic interposer 10 can be improved.

The organic insulating laminate 12 comprises: the first organic insulating layer 21 including a plurality of grooves 21a wherein the wires 13 are disposed; and the second organic insulating layer 22 laminated to the first organic insulating layer 21 in such a way as to embed the wires 13. Therefore, each of the plurality of wires 13 has a shape along each of the grooves 21a in the first organic insulating layer 21. Therefore, fine wires 13 can be formed easily by forming the plurality of grooves 21a having a fine width and interval.

The barrier metal film 14 comprises: the first barrier metal film 31 provided between the wires 13 and the inner surface of the grooves 21a; and the second barrier metal film 32 provided between the wires 13 and the second organic insulating layer 22. Therefore, the diffusion of the metal material in the wires 13 into the first organic insulating layer 21 is satisfactorily suppressed by the first barrier metal film 31. In addition, the diffusion of the metal material into the second organic insulating layer 22 is satisfactorily suppressed by the second barrier metal film 32.

The first barrier metal film 31 comprises at least one of titanium, nickel, palladium, chromium, tantalum, tungsten, and gold. Each of titanium, nickel, palladium, chromium, tantalum, tungsten, and gold hardly diffuses into the first organic insulating layer 21 and the second organic insulating layer 22, and therefore the insulation reliability of the organic interposer 10 can be further improved.

The second barrier metal film 32 may be a plated film. In this case, the second barrier metal film 32 can be selectively formed on the wire 13 in the groove 21a, and therefore the steps for manufacturing the organic interposer 10 can be simplified. For example, a resist application step, a sputtering step, and a resist removal step, and the like each for forming the second barrier metal film 32 can be omitted.

The second barrier metal film 32 may be a nickel-plated film. In this case, the second barrier metal film 32 having a satisfactory flatness can be easily formed. Besides, nickel hardly diffuses into the first organic insulating layer 21 and the second organic insulating layer 22, and therefore the insulation reliability of the organic interposer 10 can be suitably improved.

The second barrier metal film 32 may be a palladium-plated film. In this case, the second barrier metal film 32 can be thinly formed. Besides, palladium hardly diffuses into the first organic insulating layer 21 and the second organic insulating layer 22, and therefore the insulation reliability of the organic interposer 10 can be suitably improved.

The thickness of the second barrier metal film 32 may be 0.001 μm or more and 1 μm or less. In this case, the diffusion of the metal material in the wires 13 into the second organic insulating layer 22 is satisfactorily suppressed by the second barrier metal film 32.

The surface roughness Ra of the second barrier metal film 32 may be 0.01 μm or more and 1 μm or less. In this case, the second barrier metal film 32 can be closely contact with the second organic insulating layer 22 to a satisfactory level. In addition, disconnection and the like in the organic interposer 10 based on the surface roughness of the second barrier metal film 32 can be suppressed.

The thickness of the first organic insulating layer 21 may be 1 μm or more and 10 μm or less. In this case, the plurality of grooves 21a having a width and an interval of 10 μm or less can be formed using the first organic insulating layer 21.

The first organic insulating layer 21 may be a cured film prepared by curing a photosensitive organic insulating resin comprising: a photoacid generator; a phenolic hydroxy group-containing compound; and a thermosetting resin. In this case, the grooves 21a having a fine width and interval can be easily formed in the first organic insulating layer 21. Besides, moisture contained in the first organic insulating layer 21 can be reduced, and therefore the metal material becomes hard to diffuse into the first organic insulating layer 21. Accordingly, the insulation reliability of the organic interposer 10 can be improved.

According to the method for manufacturing the organic interposer 10 according to the present embodiment, the first barrier metal film 31 can be formed between the inner surface of the grooves 21a and the wiring layer 13A through step 4 to step 6. In addition, the second barrier metal film 32 can be formed between the wires 13 and the second organic insulating layer 22 in a lamination direction of the organic insulating layers through step 7 to step 9. Therefore, the diffusion of the metal material in the wires 13 into the first organic insulating layer 21 and the second organic insulating layer 22 is suppressed by the first barrier metal film 31 and the second barrier metal film 32. Accordingly, the short circuit between a plurality of wires 13 through the diffused metal material can be suppressed, and therefore the insulation reliability of the organic interposer 10 can be improved.

In step 6, the wiring layer 13A may be formed by a plating method using the first barrier metal film 31 as a seed layer. In this case, the wiring layer 13A can be formed in such a way that the first barrier metal film 31 is held between the first organic insulating layer 21 and the wiring layer 13A. Thereby, the diffusion of the metal material in the wiring layer 13A into the first organic insulating layer 21 is satisfactorily suppressed.

In step 8, the second barrier metal film 32 may be formed by a plating method using the wires 13 as a seed layer. In this case, the second barrier metal film 32 can be selectively formed on the wires 13 without using, for example, a resist or the like. Thereby, steps such as a resist formation step and a resist removal step can be omitted in forming the second barrier metal film 32, and therefore the steps for manufacturing the organic interposer 10 can be simplified.

Note that it is conceivable that the wires 13 in the organic interposer 10 is formed by a semi-additive method. The semi-additive method refers to a method for obtaining a desired wire in such a way that a seed layer is formed, a resist having a desired pattern is formed on the seed layer, an exposed portion in the seed layer is made into a thick film by an electrolytic plating method or the like, the resist is removed, and then the thin seed layer is etched. However, in the case where the semi-additive method is applied, damage to the wires in etching the thin seed layer is large. Besides, it is difficult to secure adhesive strength of the wires to the organic insulating layer. Therefore, in the case where a fine wire having a line width and a space width of, for example, 5 μm or less is formed using a semi-additive method, there is a tendency that the yield of the organic interposer is remarkably lowered. Accordingly, in the present embodiment, a trench method wherein the grooves 21a are provided in the first organic insulating layer 21, and the wires 13 are formed in the grooves 21a is adopted in the fourth step for the purpose of suppressing the lowering of the yield.

The organic interposer according to one embodiment of the present disclosure and the manufacturing method therefor are described above; however, the present disclosure is not limited to the above-described embodiment and may be appropriately modified within a range not deviating from the scope thereof. For example, the shape of a section of each of the grooves 21a formed in the first organic insulating layer 21 is not limited to an approximately rectangular shape but may be another shape such as an approximately trapezoidal shape or an approximately semi-circular shape.

In the embodiment, the wires 13, wiring layers 15a to 15c, the first barrier metal film 31, the second barrier metal film 32, the surface wire 16, and the like may have a single layer structure or may have a multi-layer structure consisting of a plurality of electrically conductive layers.

In the embodiment, the first organic insulating layer 21 comprises both the third organic insulating layer 23 and the fourth organic insulating layer 24; however, the configuration of the first organic insulating layer 21 is not limited to this. For example, the first organic insulating layer 21 may have a single layer structure. In this case, step 2 and step 3 in the manufacturing method can be put together into one step, so that the steps for manufacturing the organic interposer 10 can be simplified.

In step 7 of the manufacturing method in the embodiment, a part of the wiring layer 13A (wires 13) in the grooves 21a may be removed, and in subsequent step 8, the second barrier metal film 32 may be formed to embed the grooves 21a. In this case, the formation of a step based on the second barrier metal film 32 in the organic interposer 10 can be suppressed because the second barrier metal film 32 is formed to be embedded in the grooves 21a. That is, the surface roughness Ra of the surface made by the second organic insulating layer 22 and the second barrier metal film 32 can be reduced. Thereby, semiconductor devices and the like can be satisfactorily mounded on the organic interposer 10. Note that the removal of a part of the wires 13 in the grooves 21a utilizes, for example, dishing that occurs in performing the CMP. In addition, the part of the wires 13 in the grooves 21a is, for example, at least a part of the wires 13 positioned at the upper half in the grooves 21a.

In the embodiment, an adhesion promoting agent may be contained in the organic insulating layer contained in the organic insulating laminate 12. Examples of the adhesion promoting agent include silane coupling agents, and triazole- or tetrazole-based compounds.

As the silane coupling agent, nitrogen-containing compounds are preferably used for the purpose of improving the adhesiveness to a metal. Specific examples include N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, tris-(trimethoxysilylpropyl) isocyanurate, 3-ureidopropyltrialkoxysilane, and 3-isocyanatepropyltriethoxysilane. It is preferable that the amount of use of the silane coupling agent be 0.1 parts by mass to 20 parts by mass based on 100 parts by mass of the phenolic hydroxy group-containing compound from the viewpoint of effects obtained by addition, heat resistance, manufacturing costs, and the like.

Examples of the triazole compounds include 2-(2'-hydroxy-5'-methylphenyl)benzotriazole, 2-(2'-hydroxy-3'-tert-butyl-5'-methylphenyl)-5-chlorobenzotriazole, 2-(2'-hydroxy-3',5'-di-tert-aminophenyl)benzotriazole, 2-(2'-hydroxy-5'-tert-octylphenyl)benzotriazole, 2,2'-methylenebis[6-(2H-benzotriazol-2-yl)-4-tert-octylphenol], 6-(2-bonzotriazolyl)-4-tert-octyl-6'-tert-butyl-4'-methyl-2, 2'-methylenebisphenol, 1,2,3-benzotriazole, 1-[N,N-bis(2-ethylhexyl)aminomethyl]benzotriazole, carboxy benzotriazole, 1-[N,N-bis(2-ethylhexyl)aminomethyl] methylbenzotriazole, and 2,2'-[[(methyl-1H-benzotriazol-1-yl)methyl]imino]bisethanol.

Examples of the tetrazole compounds include 1H-tetrazole, 5-amino-1H-tetrazole, 5-methyl-1H-tetrazole, 5-phenyl-1H-tetrazole, 1-methyl-5-ethyl-1H-tetrazole, 1-methyl-5-mercapto-1H-tetrazole, 1-phenyl-5-mercapto-1H-tetrazole, 1-(2-dimethylaminoethyl)-5-mercapto-1H-tetrazole, 2-methoxy-5-(5-trifluoromethyl-1H-tetrazol-1-yl)-benzaldehyde, 4,5-di(5-tetrazolyl)-[1,2,3]triazole, and 1-methyl-5-bonzoyl-1H-tetrazole. It is preferable that the amount of use of the triazole or tetrazole-based compounds be 0.1 parts by mass to 20 parts by mass based on 100 parts by mass of the phenolic hydroxy group-containing compound from the viewpoint of effects obtained by addition, heat resistance, and manufacturing costs.

The silane coupling agents, triazole-based compounds, and tetrazole-based compounds may each be used singly or may be used in combination.

Further, an ion scavenger may be added in the organic insulating layer. The insulation reliability at the time of moisture absorption can be improved due to adsorption of ionic impurities in the organic insulating layer by the ion scavenger. Examples of such an ion scavenger include: compounds known as copper inhibitors for preventing copper from dissolving by ionization, such as triazine thiol compounds and phenol-based reducing agents; and bismuth-based, antimony-based, magnesium-based, aluminum-based, zirconium-based, calcium-based, titanium-based, and tin-based inorganic compounds in the form of a powder, and mixed inorganic compounds thereof.

Examples of the ion scavenger include inorganic ion scavengers manufactured by Toagosei Co., Ltd. (trade names: IXE-300 (antimony-based), IXE-500 (bismuth-based), IXE-600 (mixed system of antimony and bismuth), IXE-700 (mixed system of magnesium and aluminum), IXE-800 (zirconium-based), and IXE-1100 (calcium-based)). These may be used singly, or two or more thereof may be mixed and used. It is preferable that the amount of use of the ion scavengers be 0.01 parts by mass to 10 parts by mass based on 100 parts by mass of the phenolic hydroxy group-containing compound from the viewpoint of effects obtained by addition, heat resistance, and manufacturing costs.

EXAMPLES

The present invention will be described in more detail by the following Examples, but the present invention is not limited to these examples.

Example 1

Figure 11A:
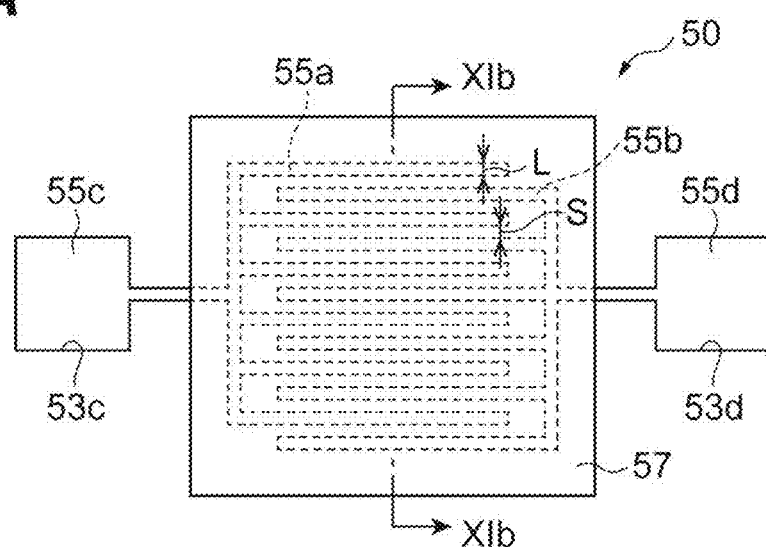
FIG. 11A is a plan view illustrating a specimen for measurement and evaluation in Examples.
Figure 11B:
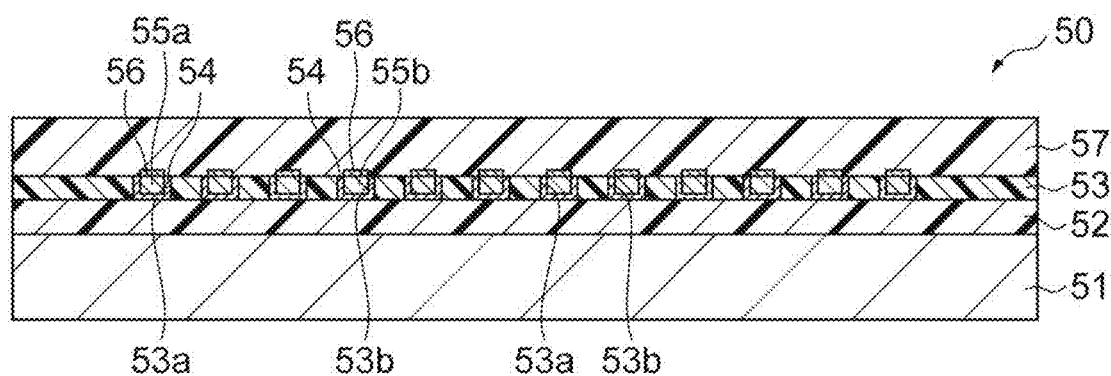
FIG. 11B is a section view taken along a line XIb-XIb in FIG. 11A.

Specimen for measurement and evaluation illustrated in FIGS. 11A and 11B were prepared in the following manner. Firstly, a photosensitive insulating resin film 52 having a thickness of 5 μm was attached to a silicon wafer 51 having a thickness of 150 mm. The photosensitive insulating resin film 52 was formed in the following manner. Firstly, a photosensitive insulating composition was obtained by blending a cresol novolak resin (manufactured by ASAHI YUKIZAI CORPORATION, trade name: TR-4020G, 100 parts by mass), 1,3,4,6-tetrakis(methoxymethyl)glycoluril (30 parts by mass), trimethylolpropane triglycidyl ether (40 parts by mass), a triarylsulfonium salt (manufactured by San-Apro Ltd., trade name: CPI-310B, 8 parts by mass), and methyl ethyl ketone (100 parts by mass). Next, the obtained photosensitive insulating composition was applied on a polyethylene terephthalate film (manufactured by Teijin DuPont Films, trade name: A-53) and was then dried in an oven at 90° C. for 10 minutes to obtain the photosensitive insulating resin film 52 having a thickness of 5 μm.

Next, the photosensitive insulating resin film 52 attached to the silicon wafer 51 was subjected to an exposure treatment, a heat treatment, a development treatment, and a heat-curing treatment in sequence. Next, a photosensitive insulating resin film 53 having a thickness of 5 μm, the photosensitive insulating resin film 53 formed in the same manner as the photosensitive insulating resin film 52, was attached to the film 52. Next, the attached photosensitive insulating resin film 53 was subjected to an exposure treatment through a photomask and was then subjected to a heat treatment, a development treatment, and a heat-curing treatment in sequence. Thereby, patterning the photosensitive insulating resin film 53 was performed to form: first grooves 53a and second grooves 53b being in the form of comb teeth such that the first grooves 53a and the second grooves 53b are engaged with each other; a first connection section 53c connecting the first grooves 53a; and a second connection section 53d connecting the second grooves 53b. The width of the first grooves 53a and the width of the second grooves 53b were each set to 10 μm. The width of these grooves corresponds to the line width L of the wires described later. In addition, the distance between each of the first grooves 53a and each of the second grooves 53b adjacent to each other (space width S) was set to 10 μm, and the length of each groove was set to 1 mm.

Next, a titanium-containing barrier metal film 54 having a thickness of 0.05 μm was formed on the photosensitive insulating resin film 53 by sputtering. Next, a copper layer was formed by an electrolytic plating method using the barrier metal film 54 as a seed layer to embed the first grooves 53a, the second grooves 53b, the first connection section 53c and the second connection section 53d. Next, a part of the copper layer and parts not covering the inner surfaces of the first grooves 53a, the second grooves 53b, the first connection section 53c, and the second connection section 53d in the barrier metal film 54 were grinded by a fly-cutting method using a surface planer. Thereby, first wires 55a embedded in the first grooves 53a, second wires 55b embedded in the second grooves 53b, a first connection wire 55c embedded in the first connection section 53c, and a second connection wire 55d embedded in the second connection section 53d were formed. As the surface planer, an automatic surface planer (manufactured by DISCO Corporation, trade name "DAS8930") was used. In addition, in the grinding by the fly-cutting method, the feeding speed was set to 1 mm/s, and the number of revolution of the spindle was set to 2000 $min^{-1}$.

Next, a nickel-phosphorus alloy-containing barrier metal film 56 having a thickness of 0.2 µm was formed by an electroless plating method using each of the first wires 55a, the second wires 55b, the first connection wire 55c, and the second connection wire 55d as a seed layer. Next, a photosensitive insulating resin film 57 having a thickness of 5 µm, the photosensitive insulating resin film 57 formed in the same manner as the photosensitive insulating resin film 52 was attached to expose at least a portion of the first connection wire 55c and a portion of the second connection wire 55d. Next, the attached photosensitive insulating resin film 57 was subjected to an exposure treatment, a heat treatment, a development treatment, and a heat-curing treatment in sequence. Thereby, the specimen 50 for measurement and evaluation illustrated in FIGS. 11A and 11B was formed. In this specimen 50 for measurement and evaluation, the first wires 55a and the first connection wire 55c are connected to each other and are covered by the barrier metal films 54, 56. Similarly, the second wires 55b and the second connection wire 55d are connected to each other and are covered by the barrier metal films 54, 56. In addition, the first wires 55a and the first connection wire 55c are insulated from the second wires 55b and the second connection wires 55d by the photosensitive insulating resin films 52, 53, 57.

A highly accelerated stress test (HAST) described as follows was performed for the purpose of checking the insulation reliability of the above-described specimen 50 for measurement and evaluation. In this test, a voltage of 3.3 V was applied between the first connection wire 55c and the second connection wire 55d under conditions of a humidity of 85% and 130° C., and the specimen was left to stand over a predetermined time. Thereby, a change in the insulation between the first wires 55a and the second wires 55b with the lapse of time was measured. In this test, when a value of resistance between the first wires 55a and the second wires 55b was $1 \times 10^6 \Omega$ or more at 200 hours after starting the test, the specimen was evaluated as A, and when a value of the resistance became less than $1 \times 10^6 \Omega$ before 200 hours from starting the test, the specimen was evaluated as B. Results of the highly accelerated stress test in Example 1 are shown in the following Table 1.

Example 2

A specimen 50 for measurement and evaluation was formed in the same manner as in Example 1 except that the line width L and the space width S were set to 5 µm, and the above-described highly accelerated stress test was performed. Results of the highly accelerated stress test in Example 2 are shown in the following Table 1.

Example 3

A specimen 50 for measurement and evaluation was formed in the same manner as in Example 1 except that the line width L and the space width S were set to 2 µm, and the above-described highly accelerated stress test was performed. Results of the highly accelerated stress test in Example 3 are shown in the following Table 1.

Example 4

A specimen 50 for measurement and evaluation was formed in the same manner as in Example 2 except that a solder resist film (manufactured by Hitachi Chemical Company, Ltd., trade name "FZ-2700GA", thickness of 30 µm) was used as the photosensitive insulating resin film 57. The above-described highly accelerated stress test was performed on this specimen 50 for measurement and evaluation. Results of the highly accelerated stress test in Example 4 are shown in the following Table 1.

Example 5

A specimen 50 for measurement and evaluation was formed in the same manner as in Example 3 except that a solder resist film (manufactured by Hitachi Chemical Company, Ltd., trade name "FZ-2700GA", thickness of 30 µm) was used as the photosensitive insulating resin film 57. The above-described highly accelerated stress test was performed on this specimen 50 for measurement and evaluation. Results of the highly accelerated stress test in Example 5 are shown in the following Table 1.

Comparative Example 1

Figure 12A:
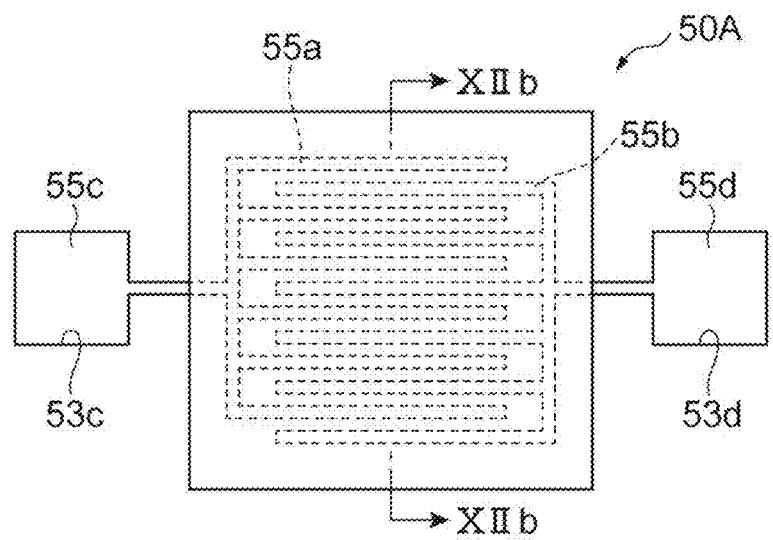
FIG. 12A is a plan view illustrating a specimen for measurement and evaluation in Comparative Examples.
Figure 12B:
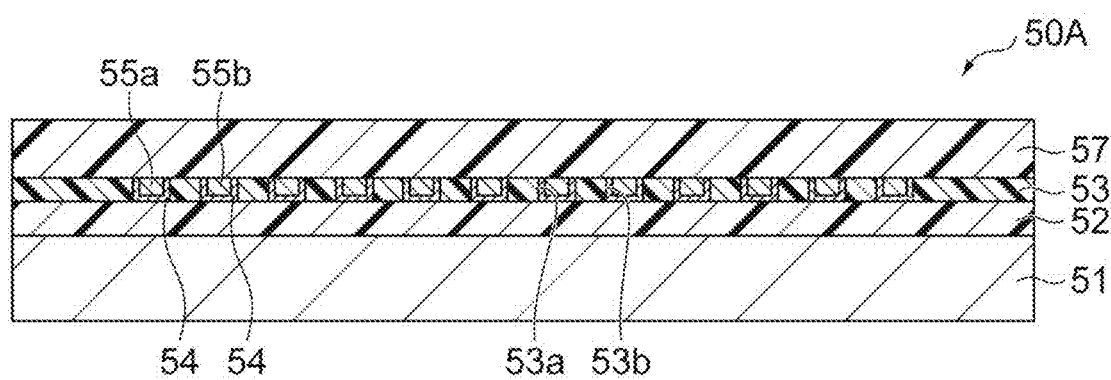
FIG. 12B is a section view taken along a line XIIb-XIIb in FIG. 12B.

A specimen 50A for measurement and evaluation was formed in the same manner as in Example 1 except that the barrier metal film 56 was not provided on the first wires 55a, on the second wires 55b, on the first connection wire 55c, and on the second connection wire 55d as illustrated in FIGS. 12A and 12B. That is, the specimen 50A for measurement and evaluation was formed in such a way that the first wires 55a, the second wires 55b, the first connection wire 55c, and the second connection wire 55d are in contact with the photosensitive insulating resin film 57. The above-described highly accelerated stress test was performed on this specimen 50A for measurement and evaluation. Results of the highly accelerated stress test in Comparative Example 1 are shown in the following Table 1.

Comparative Example 2

A specimen 50A for measurement and evaluation was formed in the same manner as in Example 2 except that the barrier metal film 56 was not provided on the first wires 55a, on the second wires 55b, on the first connection wire 55c, and on the second connection wire 55d. The above-described highly accelerated stress test was performed on this specimen 50A for measurement and evaluation. Results of the highly accelerated stress test in Comparative Example 2 are shown in the following Table 1.

Comparative Example 3

A specimen 50A for measurement and evaluation was formed in the same manner as in Example 3 except that the barrier metal film 56 was not provided on the first wires 55a, on the second wires 55b, on the first connection wire 55c, and on the second connection wire 55d. The above-described highly accelerated stress test was performed on this specimen 50A for measurement and evaluation. Results of the highly accelerated stress test in Comparative Example 3 are shown in the following Table 1.

Comparative Example 4

A specimen 50A for measurement and evaluation was formed in the same manner as in Example 4 except that the barrier metal film 56 was not provided on the first wires 55a, on the second wires 55b, on the first connection wire 55c, and on the second connection wire 55d. The above-described highly accelerated stress test was performed on this specimen 50A for measurement and evaluation. Results of the highly accelerated stress test in Comparative Example 4 are shown in the following Table 1.

Comparative Example 5

A specimen 50A for measurement and evaluation was formed in the same manner as in Example 5 except that the barrier metal film 56 was not provided on the first wires 55a, on the second wires 55b, on the first connection wire 55c, and on the second connection wire 55d. The above-described highly accelerated stress test was performed on this specimen 50A for measurement and evaluation. Results of the highly accelerated stress test in Comparative Example 5 are shown in the following Table 1.

TABLE 1

| | Line width L (μm) | Space width S (μm) | Barrier metal film 56 | Photosensitive insulating resin | Test result |
|---|---|---|---|---|---|
| Example 1 | 10 | 10 | Y | α | A |
| Example 2 | 5 | 5 | Y | α | A |
| Example 3 | 2 | 2 | Y | α | A |
| Example 4 | 5 | 5 | Y | β | A |
| Example 5 | 2 | 2 | Y | β | A |
| Comparative Example 1 | 10 | 10 | N | α | B |
| Comparative Example 2 | 5 | 5 | N | α | B |
| Comparative Example 3 | 2 | 2 | N | α | B |
| Comparative Example 4 | 5 | 5 | N | β | B |
| Comparative Example 5 | 2 | 2 | N | β | B |

In Table 1, the case where the barrier metal film 56 is provided is denoted as "Y", and the case where the barrier metal film 56 is not provided is denoted as "N". In addition, in Table 1, the case where the photosensitive insulating resin film 57 is formed in the same manner as the photosensitive insulating resin film 52 is denoted as "α", and the case where the photosensitive insulating resin film 57 is formed using the solder resist film is denoted as "β". From Table 1, it was found that all the results of the highly accelerated stress tests in Examples 1 to 5 were evaluated as A, and, in contrast, all the results of the highly accelerated stress tests in Comparative Examples 1 to 5 were evaluated as B. From these results, it was found that the insulation reliability of the specimen for measurement and evaluation is remarkably different depending on whether the barrier metal film 56 exists or not.

Figure 13A:
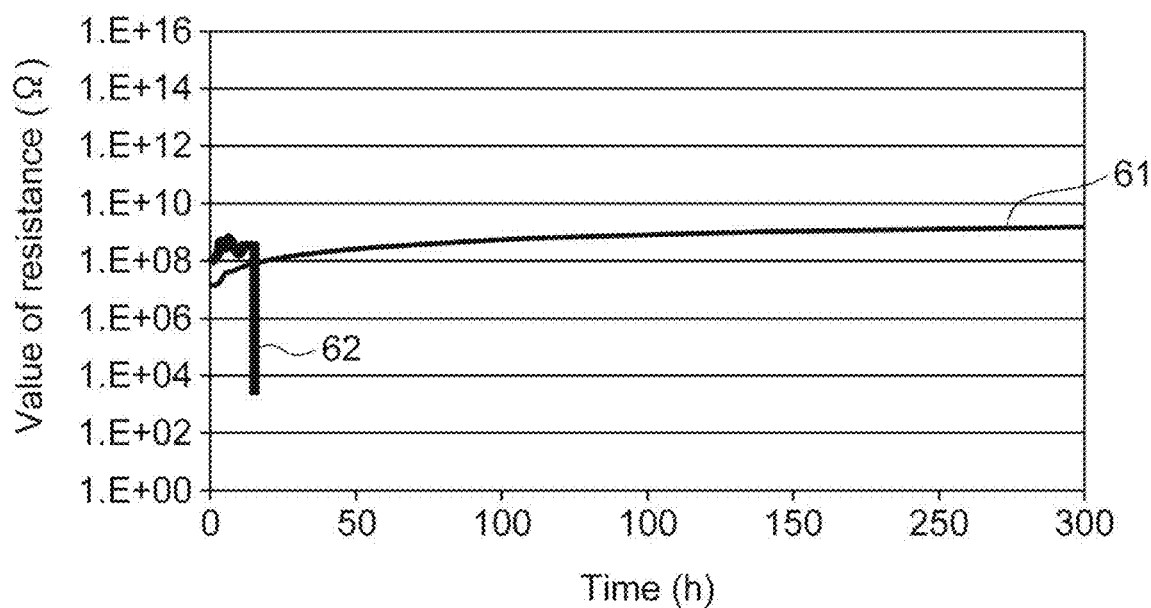
FIG. 13A is a graph showing results of highly accelerated stress tests in Example 2 and Comparative Example 2.
Figure 13B:
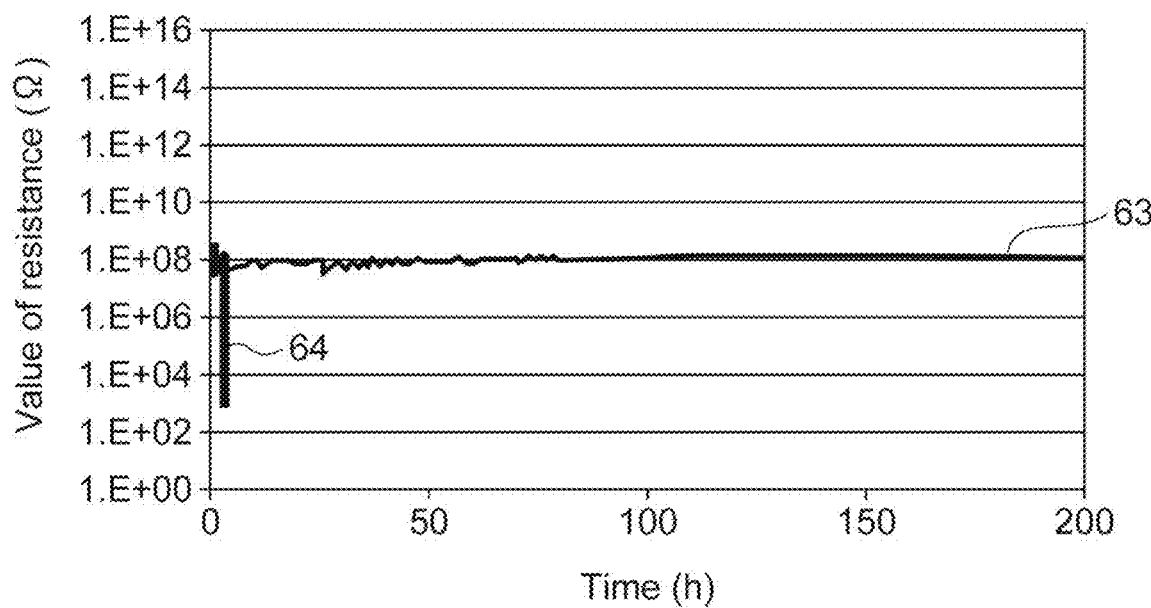
FIG. 13B is a graph showing results of highly accelerated stress tests in Examples 3 and Comparative Example 3.

FIG. 13A is a graph showing the results of the highly accelerated stress tests in Example 2 and Comparative Example 2, and FIG. 13B is a graph showing the results of the highly accelerated stress tests in Example 3 and Comparative Example 3. In FIGS. 13A and 13B, the abscissa denotes time and the ordinate denotes a value of resistance between the first wires 55a and the second wires 55b. In FIG. 13A, data 61 show the test results in Example 2, and data 62 show the test results in Comparative Example 2. In FIG. 13B, data 63 show the test results in Example 3, and data 64 show the test results in Comparative Example 3.

As shown in FIG. 13A, the value of the resistance between the first wires 55a and the second wires 55b showed $1 \times 10^6 \Omega$ or more even at 300 hours after starting the test in Example 2. On the other hand, in Comparative Example 2, the value of the resistance was reduced sharply at the point of time of about 20 hours after starting the test to become less than $1 \times 10^6 \Omega$. Similarly, as shown in FIG. 13B, the value of the resistance between the first wires 55a and the second wires 55b showed $1 \times 10^6 \Omega$ or more even at 200 hours after starting the test in Example 3, but, in contrast, in Comparative Example 3, the value of the resistance was reduced sharply at the point of time of several hours after starting the test to become less than $1 \times 10^6 \Omega$.

Figure 14A:
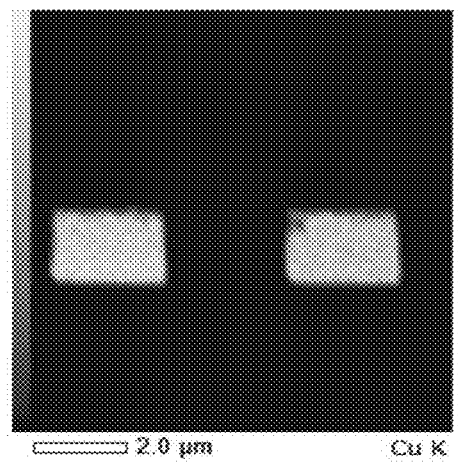
FIG. 14A shows a result of EDX analysis of Cu in a section sample of a specimen for measurement and evaluation in Example 3.
Figure 14B:
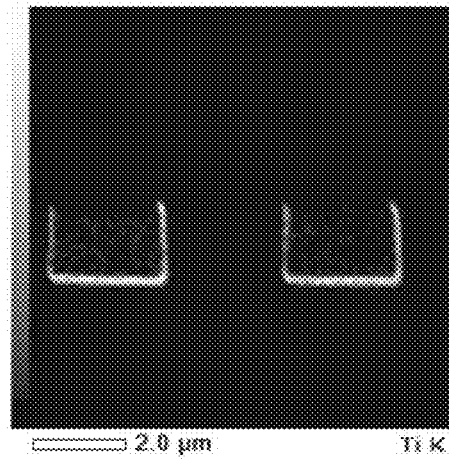
FIG. 14B shows a result of EDX analysis of Ti in the section sample.
Figure 14C:
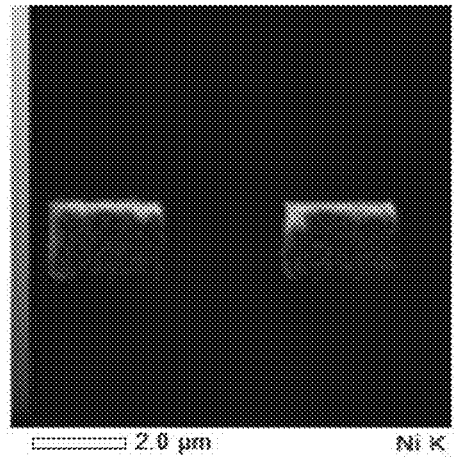
FIG. 14C shows a result of EDX analysis of Ni in the section sample.

FIGS. 14A to 14C show results of analyzing copper, titanium, and nickel components in a sample of a section of the specimen 50 for measurement and evaluation after 250 hours of highly accelerated stress test in Example 3 with TEM (transmission electron microscopy)/EDX (energy dispersive X-ray analyzer). FIG. 14A shows the result of analyzing Cu (copper) in the sample of the section of the specimen 50 for measurement and evaluation. FIG. 14B shows a result of analyzing Ti (titanium) in the sample of the section, and FIG. 14C shows a result of analyzing Ni (nickel) in the sample of the section. The analysis was performed using JEM-2100F manufactured by JEOL Ltd. as the TEM and JED-2300 manufactured by JEOL Ltd. as the EDX, and setting the acceleration volume to 200 kV. In Example 3, dissolution of the wires and the barrier metal films into the photosensitive insulating resin film was not observed after the EDX analysis test. Specifically, any of diffusion of copper constituting the copper layer surrounded by the barrier metal films 54, 56 into the photosensitive insulating resin film, diffusion of titanium constituting the barrier metal film 54 into the photosensitive insulating resin film, and diffusion of nickel constituting the barrier metal film 56 into the photosensitive insulating resin film was not ascertained.

When the specimens 50A for measurement and evaluation of Comparative Examples 2 and 3 after the highly accelerated stress tests were visually observed, it was ascertained that at least the photosensitive insulating resin film 57 was contaminated by some factor or other in Comparative Examples 2 and 3. In contrast, when the specimens 50 for measurement and evaluation of Examples 2 and 3 after the highly accelerated stress tests were visually observed, contamination of the photosensitive insulating resin films 52, 53, and 57 was not ascertained.

From those described above, it is inferred that the value of the resistance was reduced sharply in Comparative Examples 2 and 3 because the metal material in the first wires 55a and the second wires 55b diffused into the photosensitive insulating resin film 57 and the first wires 55a and the second wires 55b were short-circuited through the diffused metal material. On the other hand, it is inferred that the first wires 55a and the second wires 55b were not short-circuited in Examples 2 and 3 because the diffusion of the metal material in the first wires 55*a* or the second wires 55*b* into the photosensitive insulating resin films 52, 53, 57 was prevented by the barrier metal films 54, 56.

REFERENCE SIGNS LIST

1 Substrate,
2A to 2D Semiconductor chip
3A, 3B Underfill
4 Insulating material
10 Organic interposer
11 Substrate
12 Organic insulating laminate
13 Wire
13A Wiring layer
14 Barrier metal film
15 Through wire
21 First organic insulating layer
21*a* Groove section
21*b* Opening
22 Second organic insulating layer
31 First barrier metal film
32 Second barrier metal film
100 Semiconductor package
L Line width
S Space width

What is claimed is:

1. A substrate for a semiconductor package, comprising:
an organic insulating resin layer including a groove;
a first wire located in the groove;
a barrier conductive material covering the first wire; and
a second wire located above the first wire,
wherein the barrier conductive material includes:
 a first barrier conductive film interposed between the first wire and the groove; and
 a second barrier conductive film located on the first wire,
wherein the second wire is in contact with both of the first barrier conductive film and the second barrier conductive film; and
wherein an upper surface of the first wire is substantially aligned with an upper surface of the organic insulating resin layer.

2. The substrate according to claim 1, further comprising an insulating layer laminated to the organic insulating resin layer,
wherein the first wire is separated from both the organic insulating resin layer and the insulating layer by the barrier conductive material.

3. The substrate according to claim 1, wherein the first barrier conductive film includes at least one of titanium, nickel, palladium, chromium, tantalum, tungsten, and gold.

4. The substrate according to claim 1, wherein the second barrier conductive film is a nickel film, and wherein nickel included in the nickel film is 80mass % or more.

5. The substrate according to claim 1, wherein the second barrier conductive film is a palladium film.

6. The substrate according to claim 1, wherein a thickness of the second barrier conductive film is 0.001 μm or more and 1 μm or less.

7. The substrate according to claim 1, wherein a surface roughness of a surface made by an upper surface of the organic insulating resin layer and an upper surface of the second barrier conductive film is 0.01 μm or more and 1 μm or less.

8. The substrate according to claim 1, wherein a thickness of the organic insulating resin layer is 1 μm or more and 10 μm or less.

9. The substrate according to claim 1, wherein at least one of the first wire, the second wire, the first barrier conductive film and the second barrier conductive film has a multi-layer structure.

10. A substrate comprising:
an insulating laminate including an organic insulating resin layer with a first groove and an insulating layer with a second groove;
a first wire located in the first groove;
a barrier conductive material covering the first wire; and
a second wire located above the first wire and in the second groove,
wherein the barrier conductive material includes:
 a first barrier conductive film interposed between the first wire and the first groove; and
 a second barrier conductive film located on the first wire and in the second groove,
wherein the second wire is in contact with both of the first barrier conductive film and the second barrier conductive film, and
wherein the first wire is separated from both the organic insulating resin layer and the insulating layer by the barrier conductive material, and
wherein an upper surface of the first wire is substantially aligned with an upper surface of the organic insulating resin layer.

11. The substrate according to claim 10, wherein the first barrier conductive film includes at least one of titanium, nickel, palladium, chromium, tantalum, tungsten, and gold.

12. The substrate according to claim 10, wherein the second barrier conductive film is a nickel film, and wherein nickel included in the nickel film is 80mass % or more.

13. The substrate according to claim 10, wherein the second barrier conductive film is a palladium film.

14. The substrate according to claim 10, wherein a thickness of the second barrier conductive film is 0.001 μm or more and 1 μm or less.

15. The substrate according to claim 10, wherein a surface roughness of a surface made by an upper surface of the organic insulating resin layer and an upper surface of the second barrier conductive film is 0.01 μm or more and 1 μm or less.

16. The substrate according to claim 10, wherein a thickness of the organic insulating resin layer is 1 μm or more and 10 μm or less.

17. The substrate according to claim 10, wherein at least one of the first wire, the second wire, the first barrier conductive film and the second barrier conductive film has a multi-layer structure.

18. A method for manufacturing a substrate for a semiconductor package, the method comprising:
forming a groove in an organic insulating resin layer;
forming a first barrier conductive film on the organic insulating resin layer, wherein forming the first barrier conductive film on the organic insulating resin layer comprises covering an inner surface of the groove and an upper surface of the organic insulating resin layer;
forming a wiring layer on the first barrier conductive film in such a way as to embed the wiring layer in the groove;
thinning the wiring layer in such a way that a part of the first barrier conductive film remains on the inner surface of the groove and a part of the wiring layer remains embedded in the groove;

forming a second barrier conductive film in such a way as to cover the part of the wiring layer in the groove;

forming an insulating layer on the organic insulating resin layer and on the second barrier conductive film; and forming a wire in an opening of the insulating layer, the wire being in contact with both of the first barrier conductive film and the second barrier conductive film, wherein an upper surface of the part of the wiring layer is substantially aligned with the upper surface of the organic insulating resin layer.

19. The method according to claim 18, wherein thinning the wiring layer comprises removing an another part of the first barrier conductive film located on the upper surface of the organic insulating resin layer to expose the upper surface of the organic insulating resin layer.

20. The method according to claim 18, wherein thinning the wiring layer comprises removing an another part of the first barrier conductive film located on the upper surface of the organic insulating resin layer and a part of the organic insulating resin layer.

* * * * *